US012772705B2

(12) United States Patent
Ahn

(10) Patent No.: US 12,772,705 B2
(45) Date of Patent: Oct. 20, 2026

(54) ORGANIC LIGHT EMITTING DISPLAY APPARATUS

(71) Applicant: LG Display Co., Ltd., Seoul (KR)

(72) Inventor: JiYoung Ahn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 368 days.

(21) Appl. No.: 18/397,305

(22) Filed: Dec. 27, 2023

(65) Prior Publication Data

US 2024/0260412 A1 Aug. 1, 2024

(30) Foreign Application Priority Data

Jan. 30, 2023 (KR) ........................ 10-2023-0012090

(51) Int. Cl.
*H10K 59/80* (2023.01)
*H10K 59/127* (2023.01)
*H10K 59/35* (2023.01)
*H10K 59/38* (2023.01)

(52) U.S. Cl.
CPC ......... *H10K 59/875* (2023.02); *H10K 59/127* (2023.02); *H10K 59/351* (2023.02); *H10K 59/38* (2023.02)

(58) Field of Classification Search
CPC ............................................ H10K 59/875–879
See application file for complete search history.

(56) References Cited

U.S. PATENT DOCUMENTS 10,903,455 B2 * 1/2021 Kim ..................... H10K 59/131
2014/0306241 A1 * 10/2014 Hirakata ................ H10K 59/38 257/79
2017/0062769 A1 * 3/2017 Kim ..................... H10K 59/124
2017/0125489 A1 * 5/2017 Jang ..................... H10K 59/351
2018/0006273 A1 * 1/2018 Kim ................. H10K 59/80515
2018/0267358 A1 * 9/2018 Choi ................. G02F 1/133528
2020/0058721 A1 * 2/2020 Sim ...................... H10K 50/856
2021/0202914 A1 * 7/2021 Kim ..................... H10K 59/353
2022/0085331 A1 * 3/2022 Yoo ...................... H10K 59/878
2024/0122046 A1 * 4/2024 Lee .................. H10K 59/80515

FOREIGN PATENT DOCUMENTS

CN 204497234 U * 7/2015 ........... H10K 59/879
CN 113380862 A * 9/2021 ............. H10K 50/11
CN 117596986 A * 2/2024 ........... H10K 59/879

* cited by examiner

*Primary Examiner* — Evren Seven
(74) *Attorney, Agent, or Firm* — Morgan, Lewis & Bockius LLP

(57) ABSTRACT

An organic light emitting display apparatus includes a plurality of pixels on a substrate, each including a plurality of subpixels each including an emission area, a planarization layer including a light extraction pattern which is at the emission area of each of the plurality of subpixels and includes a plurality of concave portions, and a light emitting device layer on the light extraction pattern. One or more of the plurality of subpixels comprise a plurality of pattern regions, and the light extraction pattern at each of the plurality of pattern regions comprises a structure which has rotated with respect to a reference point.

20 Claims, 18 Drawing Sheets

ORGANIC LIGHT EMITTING DISPLAY APPARATUS

CROSS-REFERENCE TO RELATED APPLICATIONS

This application claims the benefit of the Korean Patent Application No. 10-2023-0012090 filed on Jan. 30, 2023, which is hereby incorporated by reference as if fully set forth herein.

BACKGROUND

Technical Field

The present disclosure relates to an organic light emitting display apparatus which may increase internal light extraction efficiency and may decrease a reflectance by external light.

Discussion of the Related Art

An organic light emitting display apparatus has a high response speed and has low power consumption. Unlike a liquid crystal display device, the organic light emitting display apparatus is a self-emissive display apparatus and does not require a separate light source. Thus, there is no problem in the viewing angle, whereby the organic light emitting display apparatus is subject to a next generation flat panel display apparatus.

The organic light emitting display apparatus displays an image through light emission of an organic light emitting layer including an emission layer interposed between two electrodes.

However, since some of the light emitted from the organic emission layer is not emitted to the outside due to total reflection or the like at the interface between the organic light emitting layer and the electrode and/or total reflection at the interface between the substrate and the air layer, the light extraction efficiency is reduced. Accordingly, in the organic light emitting display apparatus, research for improving in that brightness is reduced due to low light extraction efficiency, and power consumption in increased.

SUMMARY

Accordingly, embodiments of the present disclosure are directed to providing an organic light emitting display apparatus that substantially obviates one or more problems due to limitations and disadvantages of the related art.

An aspect of the present disclosure is to provide an organic light emitting display apparatus that may enhance light extraction efficiency of light that is emitted from an emission layer.

Another aspect of the present disclosure is to provide an organic light emitting display apparatus in which a black visibility characteristic or a black color (or black rising) phenomenon caused by the reflection of external light may be reduced and the occurrence of rainbow Mura and circular ring Mura may be minimized or reduced.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts of the present disclosure, as embodied and broadly described herein, in one or more aspects, an organic light emitting display apparatus may comprise a plurality of pixels on a substrate, each including a plurality of subpixels each including an emission area, a planarization layer including a light extraction pattern which is at the emission area of each of the plurality of subpixels and includes a plurality of concave portions, and a light emitting device layer on the light extraction pattern, one or more of the plurality of subpixels may comprise a plurality of pattern regions, and the light extraction pattern at each of the plurality of pattern regions may comprise a structure which has rotated with respect to a reference point.

In one or more aspects, the light extraction pattern at each of the plurality of pattern regions may be rotated by different angles. Alternatively, the light extraction pattern at one or more of the plurality of subpixels may be rotated by an angle different from that of the light extraction pattern at each of the other subpixels.

Specific details according to various examples of the present specification other than the means for solving the above-mentioned problems are included in the description and drawings below.

An organic light emitting display apparatus according to the present disclosure may enhance the light extraction efficiency of light emitted from an organic emission layer, and thus, may implement high efficiency and high luminance to extend a lifetime of the organic emission layer and may decrease power consumption, thereby implementing low power.

Moreover, in an organic light emitting display apparatus according to the present disclosure, a black visibility characteristic or a black color (or black rising) phenomenon caused by the reflection of external light may be reduced, and the occurrence of rainbow Mura and circular ring Mura may be minimized or reduced, thereby implementing real black in a non-driving or off state.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure and together with the description serve to explain principles of the disclosure.

DETAILED DESCRIPTION OF THE DISCLOSURE

Figure 1:
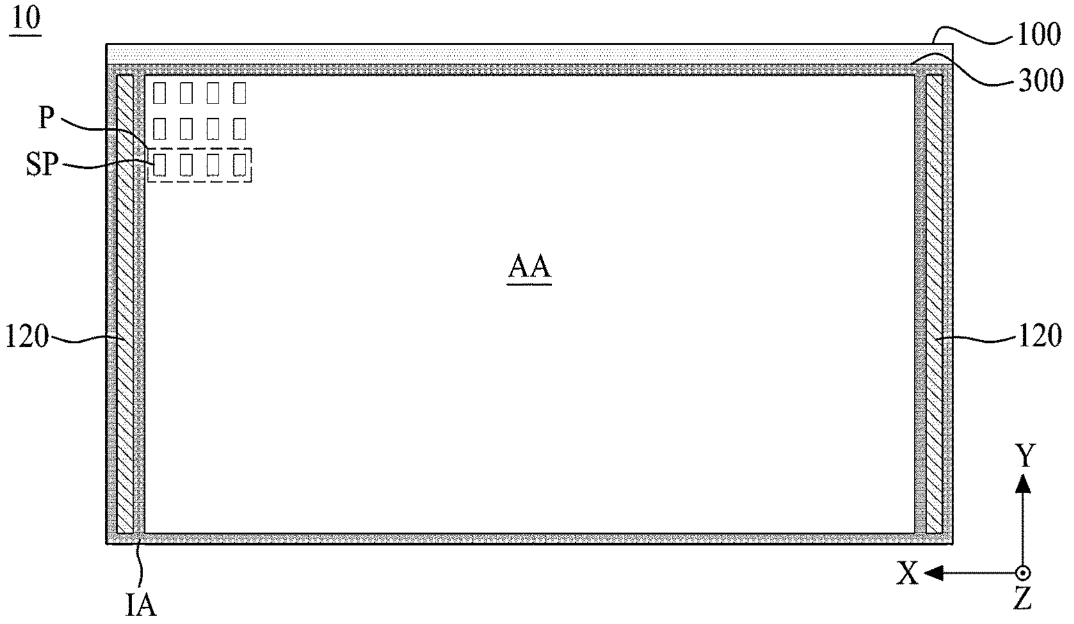
FIG. 1 is a diagram for describing an organic light emitting display apparatus according to an embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present disclosure are used, another part can be added unless 'only-' is used. The terms in a singular form may include plural forms unless noted to the contrary.

In construing an element, the element is construed as including an error range although there is no explicit description.

In describing a positional relationship, for example, when a position relation between two parts is described as 'on', 'over', 'under', and 'next', one or more other parts may be disposed between the two parts unless a more limiting term, such as "just" or "direct(ly)" is used.

Spatially relative terms, such as "below," "beneath," "lower," "above," "upper," and the like, may be used to easily describe the relationship of one element or elements and another element or elements as illustrated in the drawings.

Spatially relative terms may be understood as terms including different directions of the device in use or operation, in addition to the direction illustrated in the drawings. For example, when the device in the drawings is turned over, elements described as "below" or "beneath" of other elements may be placed "above" of other elements. Thus, the exemplary term "below" or "beneath" may include both a downward direction and an upward direction.

It will be understood that, although the terms "first", "second", and the like can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

In describing elements of the present disclosure, the terms "first", "second", "A", "B", "(a)", "(b)", etc. may be used. These terms are intended to identify the corresponding elements from the other elements, and basis, order, or number of the corresponding elements should not be limited by these terms. The expression that an element or a layer is "connected", "coupled" or "adhered" to another element or layer means the element or layer can not only be directly connected or adhered to another element or layer, but also be indirectly connected or adhered to another element or layer with one or more intervening elements or layers "disposed" or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in a co-dependent relationship.

Hereinafter, embodiments of the present disclosure will be described in detail with reference to the accompanying drawings. For convenience of description, a scale of each of elements shown in the accompanying drawings differs from a real scale, and thus, is not limited to a scale shown in the drawings.

FIG. 1 is a diagram for describing an organic light emitting display apparatus according to an embodiment of the present disclosure.

Referring to FIG. 1, the organic light emitting display apparatus according to an embodiment of the present disclosure may comprise a display panel 10 including a substrate 100 and a counter substrate 300 bonded to each other.

A thin film transistor may be formed on the substrate 100, and the substrate 100 may be a transparent glass substrate or a transparent plastic substrate. The substrate 100 may include a display area AA and a non-display area IA.

The display area AA is an area for displaying an image. The display area AA may be a pixel array area, an active area, a pixel array portion, or a screen. The display area AA may include a plurality of pixels P.

The plurality of pixels P may be disposed along a first direction X and a second direction Y crossing the first direction X. The plurality of pixels P may each be defined as a unit area from which light is actually emitted. Each of the plurality of pixels P may include a plurality of adjacent subpixels SP. For example, the first direction X may be a first lengthwise direction, a long-side lengthwise direction, a widthwise direction, or a first horizontal direction of the substrate 100. The second direction Y may be a second lengthwise direction, a short-side lengthwise direction, a lengthwise direction, a second horizontal direction, or a vertical direction of the substrate 100

The non-display area IA is an area in which an image is not displayed. The non-display area IA may be a peripheral circuit area, a signal supply area, a non-active area, or a bezel area. The non-display area IA may be configured to surround the display area AA. The display panel 10 or substrate 100 may further include a peripheral circuit portion 120 disposed at the non-display area IA. The peripheral circuit portion 120 may include a gate driving circuit connected with a plurality of subpixels SP.

The counter substrate (or opposite substrate) 300 may be configured to overlap the display area AA. The counter substrate 300 may be disposed to be opposite-bonded to the substrate 100 by an adhesive member (or a transparent adhesive), or may be provided as a type where an organic material or an inorganic material is stacked on the substrate 100. The counter substrate 300 may be an upper substrate, a second substrate, or an encapsulation substrate and may encapsulate the substrate 100.

Figure 2:
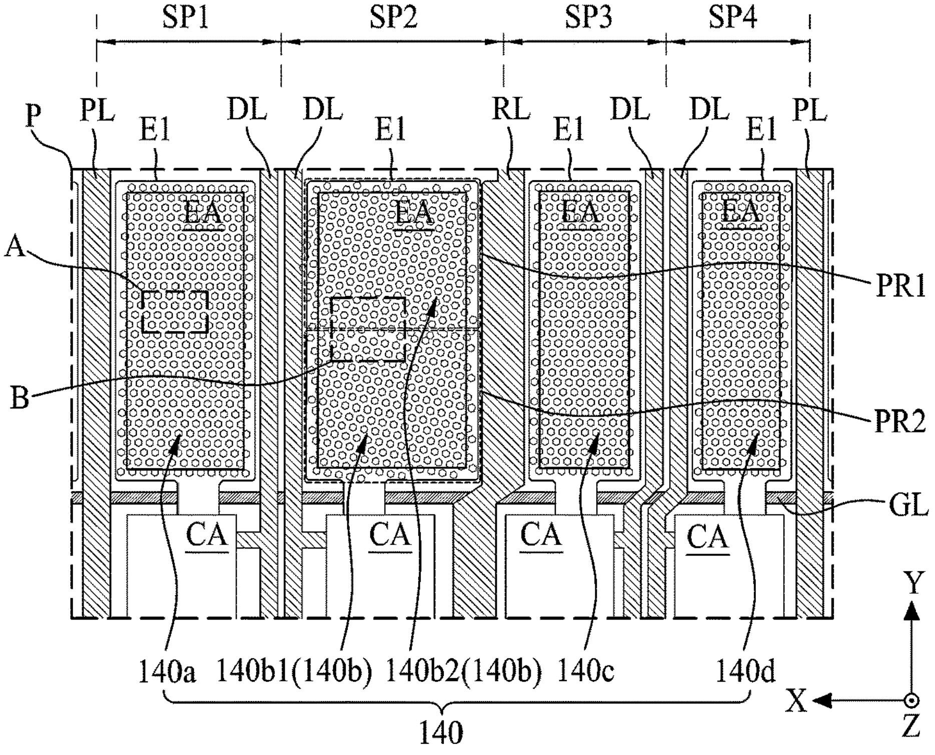
FIG. 2 is a plan view illustrating a plan structure of a pixel shown in FIG. 1.

FIG. 2 is a plan view illustrating a plan structure of a pixel shown in FIG. 1.

Referring to FIGS. 1 and 2, in the organic light emitting display apparatus (or display panel 10) according to an embodiment of the present disclosure, each of the plurality of pixel P may include a plurality of subpixels SP, e.g., four subpixels SP1, SP2, SP3, and SP4.

Each of the plurality of pixel P according to an embodiment of the present disclosure may include first to fourth subpixels SP1, SP2, SP3, and SP4 adjacent to each other along the first direction X. For example, each of the plurality of pixels P may include a first subpixel SP1 of red, a second subpixel SP2 of white, a third subpixel SP3 of blue, and a fourth subpixel SP4 of green, but embodiments according to present disclosure are not limited thereto. Each of the first to fourth subpixels SP1, SP2, SP3, and SP4 may be configured to have different sizes (or areas) from each other.

Each subpixel SP (e.g., each of the first to fourth subpixels SP1, SP2, SP3, and SP4) may include an emission area EA and a circuit area CA. The emission area EA may be disposed on one side (or an upper side) of the subpixel area. The emission area EA of each of the first to fourth subpixels SP1, SP2, SP3, and SP4 may have different sizes (or areas) from each other. For example, the emission area EA may be an opening region or a light emitting region.

The emission area EA of each of the first to fourth subpixels SP1, SP2, SP3, and SP4 may have different sizes (or areas) from each other along the first direction X. According to an embodiment of the present disclosure, the emission area EA of the second subpixel SP2 may have the largest size, the emission area EA of the fourth subpixel SP4 may have the smallest size, the emission area EA of the first subpixel SP1 may be a smaller than the emission area EA of the second subpixel SP2, and the emission area EA of the first subpixel SP1 may be a larger than the emission area EA of each of the third and fourth subpixels SP3 and SP4. Moreover, the emission area EA of the third subpixel SP3 may have a larger size than the emission area EA of the fourth subpixel SP4. However, embodiments according to present disclosure are not limited thereto.

The circuit area CA of each of the first to fourth subpixels SP1, SP2, SP3, and SP4 may be spatially separated from the emission area EA within the subpixel area SPA. For example, the circuit area CA may be disposed at the other side (or a lower side) of the subpixel area SPA, but embodiments according to present disclosure are not limited thereto. For example, at least a portion of the circuit area CA may overlap the emission area EA within the subpixel area SPA. For example, the circuit area CA may overlap an entire emission area EA within the subpixel area SPA or may be disposed below (or under) the emission area EA within the subpixel area SPA. For example, the circuit area CA may be a non-emission area or a non-opening region.

Each of the plurality of pixel P according to another embodiment of the present disclosure may further include a light transmitting portion (or a transparent portion) disposed around at least one of the emission area EA and the circuit area CA of each of the first to fourth subpixels SP1, SP2, SP3, and SP4. For example, each of the plurality of pixel P may include an emission area for subpixel corresponding to each of the plurality of subpixels SP1, SP2, SP3, and SP4, and the light transmitting portion disposed around each of the plurality of subpixels SP1, SP2, SP3, and SP4, in this case, the organic light emitting display apparatus may implement a transparent light emitting display apparatus due to light transmission of the light transmitting portion.

According to an embodiment of the present disclosure, two data lines DL extending in parallel to each other along the second direction Y may be disposed between the first subpixel SP1 and the second subpixel SP2 and between the third subpixel SP3 and the fourth subpixel SP4, respectively. A gate line GL extending along the first direction X may be disposed between the emission area EA and the circuit area CA in each of the first to fourth subpixels SP1, SP2, SP3, and SP4. A pixel power line PL extending along the second direction Y may be disposed at one side of the first subpixel SP1 or the fourth subpixel SP4. A reference line RL extending along the second direction Y may be disposed between the second subpixel SP2 and the third subpixel SP3. The reference line RL may be used as a sensing line for externally sensing a variation in characteristics of a driving thin film transistor disposed in the circuit area CA of the pixel P and/or a variation in characteristics of a light emitting device layer disposed at the circuit area CA in a sensing driving mode of the pixel P.

Each of the plurality of subpixels SP (e.g., the first to fourth subpixels SP1, SP2, SP3, and SP4) according to an embodiment of the present disclosure may include a light extraction pattern 140.

The light extraction pattern 140 may be disposed at the emission area EA of each of the plurality of subpixels SP (e.g., the first to fourth subpixels SP1, SP2, SP3, and SP4) of the pixels P. The light extraction pattern 140 may be formed or configured to have a flexural (or concave-convex) shape. The light extraction pattern 140 may irradiate light, emitted from the emission area EA, toward a light output surface, and thus, may increase the light extraction efficiency of the light emitted from the emission area EA.

In a non-driving or off state of the organic light emitting display apparatus or the display panel 10, external light input from the outside to the light extraction pattern 140 may be doubly reflected by the light extraction pattern 140 and may be output to the outside through the light output surface. Reflected light occurring due to the light extraction pattern 140 may cause radial-shaped circular ring Mura (or circular ring smear pattern) and/or rainbow Mura (or rainbow smear pattern) which are/is spread in a radial shape while having rainbow color, due to a dispersion characteristic of light based on a diffraction characteristic. The reflected light occurring due to the light extraction pattern 140 may cause radial-shaped circular ring Mura and/or rainbow Mura which are/is spread in a radial shape, due to the multi-interference and/or constructive interference of light caused by a difference between wavelength-based refraction angles, causing a reduction in black visibility characteristic of the organic light emitting display apparatus or the display panel 10.

According to an embodiment of the present disclosure, the light extraction pattern 140 configured at each of the first to fourth subpixels SP1, SP2, SP3, and SP4 may include a structure which has rotated with respect to a reference point. For example, the light extraction pattern 140 may rotate (or horizontally rotate) or reversely rotate (or horizontally and reversely rotate) with respect to a reference point within a corresponding emission area EA. For example, the reference point may be an arbitrary point or one point within the emission area EA.

According to an embodiment of the present disclosure, external light may be reflected by a rotated light extraction pattern 140 of each of the first to fourth subpixels SP1, SP2, SP3, and SP4. The rotated light extraction pattern 140 may change a diffraction path of incident light to a vertical direction and may generate a diffraction pattern (or a diffraction pattern distribution) having maximum intensity in a specific order instead of a $0^{th}$ diffraction order, and thus, diffraction patterns (or diffraction pattern distributions) occurring due to the constructive interference of reflection light reflected from the light extraction pattern 140 may be offset or minimized. Constructive interference between diffraction patterns (or diffraction pattern distributions) may be offset due to the irregularity or randomness of a rotation angle of the light extraction pattern 140.

The light extraction pattern 140 may include first to fourth light extraction patterns 140*a*, 140*b*, 140*c*, and 140*d*.

The first light extraction pattern 140*a* may be disposed or configured at the first subpixel SP1 of each of the plurality of pixels P. The second light extraction pattern 140*b* may be disposed or configured at the second subpixel SP2 of each of the plurality of pixels P. The third light extraction pattern 140*c* may be disposed or configured at the third subpixel SP3 of each of the plurality of pixels P. The fourth light extraction pattern 140*d* may be disposed or configured at the fourth subpixel SP4 of each of the plurality of pixels P.

Each of the first to fourth light extraction patterns 140*a*, 140*b*, 140*c*, and 140*d* may be rotated or reversely rotated with respect to a reference point within a corresponding emission area EA.

Any one of the first to fourth light extraction patterns 140*a*, 140*b*, 140*c*, and 140*d* may be rotated or reversely rotated by different angles. For example, the first, third, and fourth light extraction patterns 140*a*, 140*c*, and 140*d* may be rotated or reversely rotated by a same angle. The second light extraction pattern 140*b* may be rotated or reversely rotated by an angle which differs from the first, third, and fourth light extraction patterns 140*a*, 140*c*, and 140*d*. For example, a rotation angle of each of the first, third, and fourth light extraction patterns 140*a*, 140*c*, and 140*d* may differ from that of a rotation angle of the second light extraction pattern 140*b*.

According to an embodiment of the present disclosure, one or more of the first to fourth light extraction patterns 140*a*, 140*b*, 140*c*, and 140*d* may include a plurality of sub light extraction patterns 140*b*1 and 140*b*2. For example, one or more of the first to fourth light extraction patterns 140*a*, 140*b*, 140*c*, and 140*d* may include two or more sub light extraction patterns 140*b*1 and 140*b*2. For example, one or more of the first to fourth light extraction patterns 140*a* to 140*d* may include a first sub light extraction pattern 140*b*1 and a second sub light extraction pattern 140*b*2. For example, the plurality of sub light extraction patterns 140*b*1 and 140*b*2 or the first sub light extraction pattern 140*b*1 and the second sub light extraction pattern 140*b*2 may be rotated or reversely rotated by different angles from each other. For example, each of the sub light extraction patterns 140*b*1 and 140*b*2 may be a sub light extraction pattern, a sub extraction pattern, a local pattern, a local light extraction pattern, a local extraction pattern, or a domain pattern.

According to an embodiment of the present disclosure, one or more of the plurality of subpixels SP may include a plurality of pattern regions. For example, any one of the plurality of subpixels SP may include a plurality of pattern regions. For example, any one of the first to fourth subpixels SP1, SP2, SP3, and SP4 may include a plurality of pattern regions PR1 and PR2. For example, any one of the first to fourth subpixels SP1, SP2, SP3, and SP4 may include two or more pattern regions PR1 and PR2. One or more of the plurality of subpixels SP may include a first pattern region PR1 and a second pattern region PR2. For example, any one of the first to fourth subpixels SP1, SP2, SP3, and SP4 may include the first pattern region PR1 and the second pattern region PR2.

The first pattern region PR1 and the second pattern region PR2 may be separated or spatially separated from each other within one subpixel. The first pattern region PR1 and the second pattern region PR2 may be disposed along any one direction of the first direction X, the second direction Y, and a diagonal direction between the first direction X and the second direction Y. For example, the first pattern region PR1 and the second pattern region PR2 may be disposed along the second direction Y. For example, the first pattern region PR1 and the second pattern region PR2 may include first and second division regions of a subpixel which are spatially separated from each other along the second direction Y. For example, each of the first pattern region PR1 and the second pattern region PR2 may be a sub pattern region, a sub light extraction region, a local region, a local pattern region, a local light extraction region, a domain, or a subdomain.

According to an embodiment of the present disclosure, different light extraction patterns 140 may be disposed or configured at the plurality of pattern regions (e.g., the first pattern region PR1 and the second pattern region PR2) included in the one or more subpixels in the plurality of subpixels SP. For example, the light extraction pattern 140 at each of the plurality of pattern regions may include a structure that has rotated or reversely rotated with respect to a reference point. For example, the light extraction pattern 140 at each of the plurality of pattern regions may be rotated or reversely rotated by different angles. For example, the light extraction patterns 140 respectively configured at the first pattern region PR1 and the second pattern region PR2 may be rotated or reversely rotated by different angles. For example, a rotation angle of the light extraction pattern configured at the first pattern region PR1 may differ from that of a rotation angle of the light extraction pattern 140 configured at the second pattern region PR2. For example, the first sub light extraction pattern **140*b*1 may be formed or configured at the first pattern region PR1, and the second sub light extraction pattern 140*b*2 may be formed or configured at the second pattern region PR2**.

According to an embodiment of the present disclosure, a plurality of subpixels SP may include red subpixels, white subpixels, blue subpixels, and green subpixels. For example, the first to fourth sub-pixels SP1, SP2, SP3, and SP4 may include a red sub-pixel SP1, a white sub-pixel SP2, a blue sub-pixel SP3, and a green sub-pixel SP4. Any of the red sub-pixel SP1, white sub-pixel SP2, blue sub-pixel SP3, and green sub-pixel SP4 may include a plurality of pattern regions. For example, the red subpixel SP1 may include a first pattern region PR1, and a first sub light extraction pattern **140*b*1 for reflecting red light may be formed or configured at the first pattern region PR1. For example, the white subpixel SP2 may include a second pattern area PR2, and the second sub light extraction pattern 140*b*2 for reflecting white light may be formed or configured at the second pattern area PR2. For example, the blue subpixel SP3 may include a third pattern region PR1, and the third sub light extraction pattern 140*b*3 for reflecting blue light may be formed or configured at the third pattern region PR3. For example, the green subpixel SP4 may include a fourth pattern region PR4, and the fourth sub light extraction pattern 140*b*4 for reflecting green light may be formed or configured at the fourth pattern region PR4. The white reflection light reflected by the second light extraction pattern 140*b* of each of the plurality of pixels P may include all wavelengths, and thus, when the regularity of the white reflection light is high based on the regularity of the second light extraction pattern 140*b*, a probability of the occurrence of constructive interference (or light interference) occurring between each of red, blue, and green reflection lights reflected from the other adjacent first, third, and fourth light extraction patterns 140*a*, 140*c*, and 140*d* and the white reflection light may be relatively high. Accordingly, a diffraction pattern (or diffraction pattern distribution) may occur due to the constructive interference of reflection light reflected by each of the first to fourth light extraction patterns 140*a* to 140*d* of each of the plurality of pixels P. On the other hand, when the second light extraction pattern 140*b* at each of the plurality of pixels P is low in regularity or does not have regularity, a probability of the occurrence of constructive interference occurring between reflected lights may decrease or a probability of the occurrence of destructive interference may increase due to the irregularity of the white reflection light, and thus, may prevent or minimize the occurrence of radial-shaped rainbow Mura and/or radial-shaped circular ring Mura which are/is spread in a radial shape, due to the constructive interference of reflected light. Accordingly, the second light extraction pattern 140*b*** at each of the plurality of pixels P may be formed or configured so that there is no regularity of the reflected light, or the regularity of the reflected light is minimized.

According to an embodiment of the present disclosure, red, blue, and green reflection lights respectively reflected from the first, third, and fourth light extraction patterns **140*a*, 140*c*, and 140*d* at each of the plurality of pixels P may include only a predetermined wavelength, and thus, even when each of the first, third, and fourth light extraction patterns 140*a*, 140*c*, and 140*d* has regularity, a probability of the occurrence of constructive interference (or light interference) occurring between red, blue, and green reflected lights may be relatively low. Accordingly, the first, third, and fourth light extraction patterns 140*a*, 140*c*, and 140*d* at each of the plurality of pixels P may have regularity for the easiness of a design, but embodiments of the present disclosure are not limited thereto. For example, in a case where the first, third, and fourth light extraction patterns 140*a*, 140*c*, and 140*d*** at each of the plurality of pixels P are formed or configured so that there is no regularity or regularity is minimized, a probability of the occurrence of constructive interference occurring between reflected lights may be more reduced, or a probability of the occurrence of destructive interference may more increase.

According to an embodiment of the present disclosure, the second subpixel SP2 of the first to fourth subpixels SP1, SP2, SP3, and SP4 may include a plurality of pattern regions PR1 and PR2, or may include a first pattern region PR1 and a second pattern region PR2. The first pattern region PR1 and the second pattern region PR2 may be disposed along the second direction Y. For example, the first pattern region PR1 may be an upper region (or a top region) of the second subpixel SP1, and the second pattern region PR2 may be a lower region (or a bottom region) of the second subpixel SP2. For example, the second subpixel SP2 may have an upward-downward two-division structure (or a vertical two-division tetragonal structure) by the first pattern region PR1 and the second pattern region PR2. For example, the first pattern region PR1 and the second pattern region PR2 may have a same size (or area), but embodiments of the present disclosure are not limited thereto.

According to an embodiment of the present disclosure, the second light extraction pattern **140*b* of the first to fourth light extraction patterns 140*a*, 140*b*, 140*c*, and 140*d* may include a first sub light extraction pattern 140*b*1 disposed or configured at the first pattern region PR1 of the second subpixel SP2 and a second sub light extraction pattern 140*b*2 disposed or configured at the second pattern region PR2 of the second subpixel SP2. The first sub light extraction pattern 140*b*1 and the second sub light extraction pattern 1402 may rotate by different angles within the second subpixel SP. Accordingly, the regularity of reflection light reflected by the second light extraction pattern 140*b* of the second subpixel SP2 may be minimized, or the randomness of the reflection light may increase. For example, an angle difference between a rotation angle of the first sub light extraction pattern 140*b*1 at the first pattern region PR1 and a rotation angle of the second sub light extraction pattern 140*b*2 at the second pattern region PR2** may be a maximum of 30 degrees.

Therefore, the regularity or randomness of a diffraction pattern of reflected light may increase based on a rotation angle of each of the first sub light extraction pattern **140*b*1 and the second sub light extraction pattern 140*b*2 of the second light extraction pattern 140*b* and the first, third, and fourth light extraction patterns 140*a*, 140*c*, and 140*d* at each of the plurality of pixels P, and thus, may prevent or minimize the occurrence of radial-shaped rainbow Mura and/or radial-shaped circular ring Mura which are/is spread in a radial shape, due to a diffraction characteristic of reflection light reflected by the light extraction pattern 140 of the display area AA. For example, a black visibility characteristic or a black color (or black rising) phenomenon caused by the reflection of external light may be reduced in a non-driving or off state of the organic light emitting display apparatus or the display panel 10**, thereby implementing real black.

Figure 3:
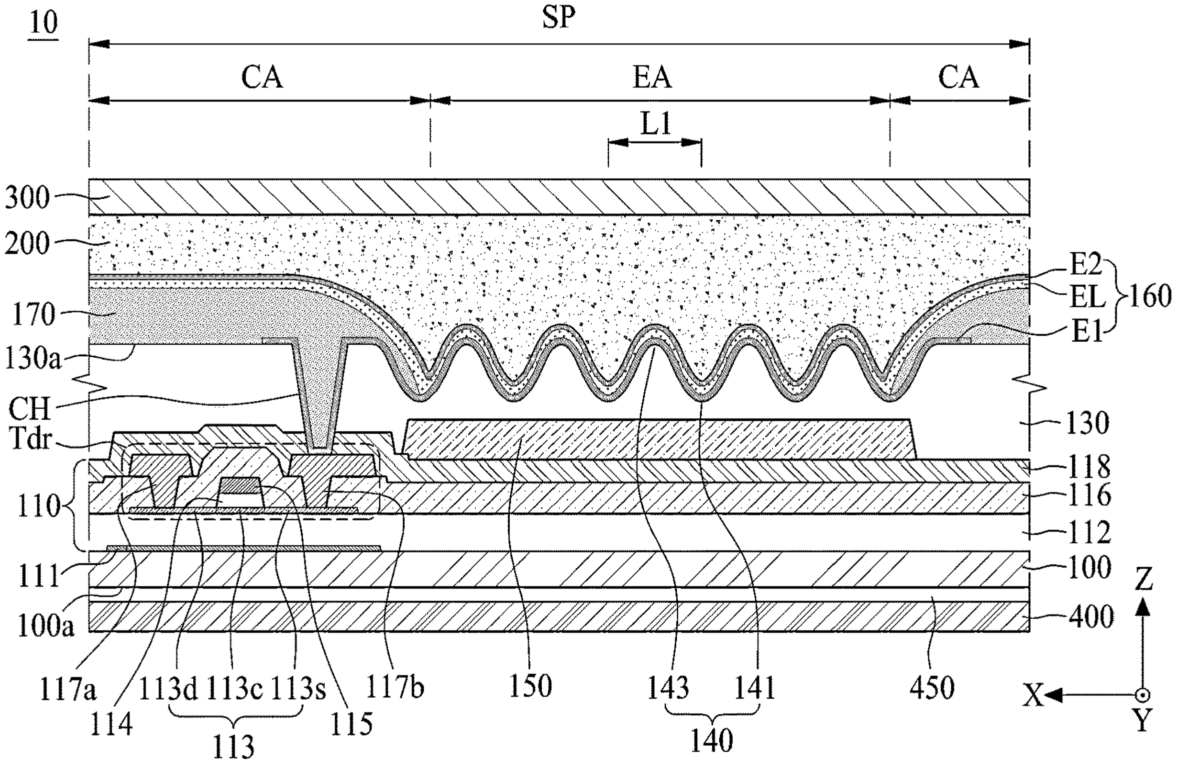
FIG. 3 is a cross-sectional view illustrating a cross-sectional structure of one subpixel according to an embodiment of the present disclosure.

FIG. 3 is a cross-sectional view illustrating a cross-sectional structure of one subpixel according to an embodiment of the present disclosure.

Referring to FIGS. 2 and 3, the organic light emitting display apparatus or display panel 10 according to an embodiment of the present disclosure may comprise a substrate 100.

A thin film transistor may be formed on the substrate 100, and the substrate 100 may be a first substrate, a base substrate, a lower substrate, a transparent glass substrate, a transparent plastic substrate, or a base member.

A pixel circuit layer 110, a planarization layer 130, and a light emitting device layer 160 may be formed on the substrate 100. The pixel circuit layer 110 may include a buffer layer 112, a pixel circuit, and a protection layer 118.

The organic light emitting display apparatus or display panel 10 according to an embodiment of the present disclosure may further comprise an insulation layer disposed between the substrate 100 and the light extraction pattern 140. The buffer layer 112 may be disposed at an entirety of an opposite surface of a first surface (or a front surface, which is referred to as a light extraction surface hereafter) **100*a* of the substrate 100. The buffer layer 112 may prevent or at least reduce materials contained in the substrate 100 from spreading to a transistor layer during a high-temperature process in the manufacturing of the thin film transistor, or may prevent external water or moisture from permeating into the light emitting device layer 160. Optionally, depending on the case, the buffer layer 112** may be omitted.

The pixel circuit may include a driving thin film transistor Tdr disposed at a circuit area CA of each subpixel SP (or each subpixel areas SPA) of the plurality of pixel P. The driving thin film transistor Tdr may include an active layer 113, a gate insulating layer 114, a gate electrode 115, an interlayer insulating layer 116, a drain electrode **117*a*, and a source electrode 117*b***.

The active layer 113 may be configured with a semiconductor material based on any one of amorphous silicon, polycrystalline silicon, oxide, and organic materials. The active layer 113 may include a channel region **113*c*, a drain region 113*d*, and a source region 113*s***.

The gate insulating layer 114 may be formed at an island shape on (or over) the channel region **113*c* of the active layer 113, or may be formed on (or over) the entire front surface of the buffer layer 112 or substrate 100 including the active layer 113**.

The gate electrode 115 may be disposed on (or over) the gate insulating layer 114 to overlap the channel region **113*c* of the active layer 113**.

The interlayer insulating layer 116 may be formed on (or over) the gate electrode 115, and the drain region **113*d* and the source region 113*s* of the active layer 113. The interlayer insulating layer 116 may be formed at an entire front surface of the buffer layer 112 or substrate 100. For example, the interlayer insulating layer 116** may include an inorganic material or an organic material.

The drain electrode **117*a* may be disposed on (or over) the interlayer insulating layer 116 to be electrically connected to the drain region 113*d* of the active layer 113. The source electrode 117*b* may be disposed on (or over) the interlayer insulating layer 116 to be electrically connected to the source region 113*s* of the active layer 113**.

The pixel circuit may further include at least one capacitor and at least one switching thin film transistors which are disposed at the circuit area CA together with the driving thin film transistor Tdr.

The organic light emitting display apparatus according to an embodiment of the present disclosure may further include a light shielding layer 111 provided below (or under) at least one active layer 113 of the driving thin film transistor Tdr, a first switching thin film transistor, and a second switching thin film transistor. The light shielding layer 111 may be configured to reduce or prevent a change in a threshold voltage of the thin film transistor caused by external light.

The protection layer 118 may be configured over the pixel circuit. For example, the protection layer 118 may be configured to surround the drain electrode **117*a* and the source electrode 117*b* of the driving thin film transistor Tdr and the interlayer insulating layer 116. For example, the protection layer 118 may be formed of an inorganic insulating material and may be expressed in terms such as a passivation layer. For example, the protection layer 118** may be omitted.

The planarization layer 130 may be provided over the pixel circuit layer 110. The planarization layer 130 may be formed at the entire display area AA and the remaining portions of the non-display area IA except the pad area. For example, the planarization layer 130 may include an extension portion (or expansion portion) extended or expanded from the display area AA to the remaining portions of the non-display area IA except the pad area. Accordingly, the planarization layer 130 may have a relatively large size than the display area AA.

The planarization layer 130 according to an embodiment of the present disclosure may be formed to have a relatively large thickness so that the planarization layer 130 may provide a planarized surface **130*a* over the pixel circuit layer 110. For example, the planarization layer 130** may be formed of an organic material such as one of photo acrylic, benzocyclobutene, polyimide, and fluorine resin, or the like.

The planarization layer 130 may include a light extraction pattern 140 disposed at each subpixel SP. The light extraction pattern 140 may be formed at the planarization layer 130 to overlap the emission area EA of each subpixel SP.

The light extraction pattern 140 may be formed at the planarization layer 170 to have a curved portion (or non-flat portion). The light extraction pattern 140 may be formed at the planarization layer 130 to have a curved shape (or an uneven shape). The light extraction pattern 140 may have a size larger than the emission area EA. For example, the light extraction pattern 140 may be a light extraction pattern, a light extraction pattern portion, a curved pattern portion, an uneven pattern portion, a micro lens, or a light scattering portion.

The light extraction pattern 140 or the first to fourth light extraction patterns 140*a*, 140*b*, 140*c*, and 140*d* according to an embodiment of the present disclosure may include a plurality of concave portions 141, and a convex portion 143 disposed around each of the plurality of concave portions 141. The convex portion 143 may be configured to surround each of the plurality of concave portions 141

Each of the plurality of concave portions 141 may be implemented to be concave from the upper surface (or a flat surface) 130*a* of the planarization layer 130. Specifically, each of the plurality of concave portions 141 may be implemented to be concave from the upper surface 130*a* of the planarization layer 130 near a side of the light emitting device layer 160, towards a side of the pixel circuit layer 110. The plurality of concave portions 141 may have a same height with respect to the upper surface 130*a* of the planarization layer 130, but some of the plurality of concave portions 141 may have different depths. For example, a bottom surface of each of the plurality of concave portions 141 may be positioned between the upper surface 130*a* of the planarization layer 130 and the substrate 100.

The convex portion 143 may be formed to be connected to each other between the plurality of concave portions 141. The convex portion 143 may be provided at the planarization layer 130 that overlaps the emission area EA to have a shape that may maximize an external extraction efficiency of light generated from the subpixel SP based on an effective emission area of the light emitting device layer 160. The convex portion 143 may change a propagation path of light emitted from the light emitting device layer 160 toward the light extraction surface 100*a* and extracts the light totally reflected within the light emitting device layer 160 toward the light extraction surface 100*a*, and thus, degradation of the light extraction efficiency caused by the light which is trapped within the light emitting device layer 160 may prevent or minimize.

A top portion of the convex portion 143 according to an embodiment of the present disclosure may be adjacent to the light emitting device layer 160 and may have a sharp structure and a convex curved shape, so as to increase the light extraction efficiency. For example, the top portion of the convex portion 143 may include a dome or bell structure having a convex cross-sectional shape.

The convex portion 143 according to an embodiment of the present disclosure may include an inclined portion having a curved shape between a bottom portion and the top portion (or peak portion). The inclined portion of the convex portion 143 may form or configure the concave portion 141. For example, the inclined portion of the convex portion 143 may be an inclined surface or a curved portion. The inclined portion of the convex portion 143 according to an embodiment of the present disclosure may have a cross-sectional structure having Gaussian curve. In this case, the inclined portion of the convex portion 143 may have a tangent slope which increases progressively from the bottom portion to the top portion, and then decreases progressively.

According to an embodiment of the present disclosure, the light extraction pattern 140 at each of the plurality of subpixels SP1, SP2, SP3, and SP4 may have a structure which has rotated with respect to a reference point (or an arbitrary point) within the emission area EA. For example, the light extraction pattern 140 which is disposed at each of the plurality of subpixels SP1, SP2, SP3, and SP4 may have a structure which has rotated with respect to a center portion CP or an end of any one of the plurality of concave portions 141. For example, the center portion CP or the end of any one of the plurality of concave portions 141 at each of the plurality of subpixels SP1, SP2, SP3, and SP4 may be a reference point for rotation of the light extraction pattern 140 within the corresponding subpixels SP1, SP2, SP3, and SP4.

The light emitting device layer 160 may be disposed on (or over) the light extraction pattern 140 overlapping the emission area EA of each subpixel SP. For example, the light emitting device layer 160 may directly contact a surface of the light extraction pattern 140.

The light emitting device layer 160 according to an embodiment of the present disclosure may include a first electrode E1, an emission layer EL, and a second electrode E2. For example, the first electrode E1, the emission layer EL, and the second electrode E2 may be configured to emit the light toward the substrate 100 according to a bottom emission type, but embodiments according to present disclosure are not limited thereto.

The first electrode E1 may be formed on (or over) the planarization layer 130, and may be electrically connected to a source electrode 117*b* (or a drain electrode 117*a*) of the driving thin film transistor Tdr. One end of the first electrode E1 which is close to the circuit area CA may be electrically connected to the source electrode 117*b* (or a drain electrode 117*a*) of the driving thin film transistor Tdr via an electrode contact hole CH provided at the planarization layer 130 and the protection layer 118.

The first electrode E1 directly contacts the light extraction pattern 140 and thus, may have a shape conforming to the shape of the light extraction pattern 140. As the first electrode E1 is formed (or deposited) over the planarization layer 130 to have a relatively small thickness, the first electrode E1 may have a surface morphology conforming to a surface morphology of the light extraction pattern 140 including the convex portion 143 and the plurality of concave portions 141. For example, the first electrode E1 is formed in a conformal shape based on the surface shape (morphology) of the light extraction pattern 140 by a deposition process of a transparent conductive material, whereby the first electrode E1 may have a cross-sectional structure whose shape is a same as the light extraction pattern 140.

The emission layer EL may be formed on (or over) the first electrode E1 and may directly contact the first electrode E1. As the emission layer EL is formed (or deposited) on (or over) the first electrode E1 to have a relatively large thickness in comparison to the first electrode E1, the emission layer EL may have a surface morphology which is the same as or different from the surface morphology in each of the plurality of concave portions 141 and the convex portion 143 or the surface morphology of the first electrode E1. According to an embodiment of the present disclosure, the emission layer EL is formed in a conformal shape based on the surface shape (morphology) of the first electrode E1, in this case, the emission layer EL may have a cross-sectional structure whose shape is a same as the first electrode E1. According to another embodiment of the present disclosure, the emission layer EL may be formed in a non-conformal shape which does not conform to the surface shape (or morphology) of the first electrode E1, in this case, the emission layer EL may have a cross-sectional structure whose shape may be different from the first electrode E1.

The emission layer EL according to an embodiment of the present disclosure has a thickness that gradually increases toward the bottom surface of the convex portion 143 or the concave portion 141. For example, the emission layer EL may have the thinnest thickness at the inclined surface (or curved surface) between the convex portion 143 and the concave portion 141, but embodiments according to present disclosure are not limited thereto.

The emission layer EL according to an embodiment of the present disclosure includes two or more organic light emitting layers to emit white light. As an example, the emission layer EL may include a first organic light emitting layer and a second organic light emitting layer to emit white light by mixing a first light and a second light.

The second electrode E2 may be formed on (or over) the emission layer EL and may directly contact the emission layer EL. The second electrode E2 may be formed (or deposited) on (or over) the emission layer EL to have a relatively thin thickness compared to the emission layer EL. The second electrode E2 may be formed (or deposited) on (or over) the emission layer EL to have a relatively thin thickness, and thus may have a surface morphology corresponding to the surface morphology of the emission layer EL. For example, the second electrode E2 may have a cross-sectional structure whose shape may be the same as or different from the light extraction pattern 140.

The second electrode E2 according to an embodiment of the present disclosure may include a metal material having a high reflectance to reflect the incident light emitted from the emission layer EL toward the substrate 100. For example, the second electrode E2 may include a single-layered structure or multi-layered structure of any one material selected of aluminum (Al), argentums (Ag), molybdenum (Mo), aurum (Au), magnesium (Mg), calcium (Ca), or barium (Ba), or alloy of two or more materials selected from aluminum (Al), argentums (Ag), molybdenum (Mo), aurum (Au), magnesium (Mg), calcium (Ca), or barium (Ba). The second electrode E2 may be a cathode electrode.

The traveling path of the light generated from the emission layer EL may change toward the light extraction surface (or a light emitting surface) 100*a* by the concave portion 141 and/or the convex portion 143 of the light extraction pattern 140, to thereby increase the external extraction efficiency of the light emitted from the emission layer EL.

The organic light emitting display apparatus or the display panel 10 according to an embodiment of the present disclosure may further include a bank layer 170. The bank layer 170 may be disposed on (or over) the planarization layer 130 and an edge portion of the first electrode E1. The bank layer 170 may be configured in a transparent material or an opaque material. For example, the bank layer 170 may be a transparent bank layer or a black bank layer. For example, the bank layer 170 may include a photosensitizer including a black pigment, in this case, the bank layer 170 may function as a light blocking member between adjacent subpixels SP.

The organic light emitting display apparatus or the display panel 10 according to an embodiment of the present disclosure may further include a color filter layer 150.

The color filter layer 150 may be disposed between the substrate 100 and the light extraction pattern 140. The color filter layer 150 may be disposed between the substrate 100 and the light extraction pattern 140 to overlap at least one emission area EA. The color filter layer 150 according to an embodiment of the present disclosure may be disposed between the planarization layer 130 and the protection layer 118 to overlap with the emission area EA. The color filter layer 150 according to another embodiment of the present disclosure may be disposed between the interlayer insulation layer 116 and the protection layer 118 to overlap with the emission area EA, or may be disposed between the substrate 100 and the interlayer insulation layer 116.

The color filter layer 150 may have a size which is greater wider than the emission area EA. The color filter layer 150 may have a size which is greater than the emission area EA and smaller than the light extraction pattern 140 of the planarization layer 130, but embodiments according to present disclosure are not necessarily limited to thereto, and the color filter layer 150 may have a size which is greater than the light extraction pattern 140 of the planarization layer 130. For example, an edge portion of the color filter layer 150 may overlap the bank layer 170. For example, the color filter layer 150 may have a size which is greater than a size corresponding to an entire area of each subpixel SP, thereby reducing light leakage between adjacent subpixels SP.

The color filter layer 150 may be configured to transmit only the wavelength of a color set in the subpixel SP. For example, when one pixel P is configured with the first to fourth subpixels SP1, SP2, SP3, and SP4, the color filter layer 150 may include a red color filter disposed in the first subpixel SP1, a blue color filter disposed in the third subpixel SP3, and a green color filter disposed in the fourth subpixel SP4. The second subpixel SP2 may not include a color filter layer or may include a transparent material to compensate a step difference between adjacent subpixels, thereby emitting white light.

The organic light emitting display apparatus or the display panel 10 according to an embodiment of the present disclosure may further include an encapsulation portion 200.

The encapsulation portion 200 may be formed on (or over) the substrate 100 to surround the light emitting device layer 160. The encapsulation portion 200 may be formed on (or over) the second electrode E2. For example, the encapsulation portion 200 may surround the display area AA. The encapsulation portion 200 may protect the thin film transistor and the emission layer EL or the like from external impact and prevent oxygen or/and water (or moisture) and particles from being permeated into the emission layer EL.

The encapsulation portion 200 according to an embodiment of the present disclosure may include a plurality of inorganic encapsulation layer. Furthermore, the encapsulation portion 200 may further include at least one organic encapsulation layer interposed between the plurality of inorganic encapsulation layer. The encapsulation portion 200 according to another embodiment of the present disclosure may be changed to a filler surrounding (or completely surrounding) an entire display area AA. In this case, the counter substrate 300 may be bonded to the substrate 100 by using the filler. The filler may include a getter material that absorbs oxygen or/and water (or moisture) or the like.

The organic light emitting display apparatus or the display panel 10 according to an embodiment of the present disclosure may further include a counter substrate 300.

The counter substrate 300 may be coupled to the encapsulation portion 200. The counter substrate 300 may be made of a plastic material, a glass material, or a metal material. For example, when the encapsulation portion 200 includes the plurality of inorganic encapsulation layers, the counter substrate 300 may be omitted.

Alternatively, when the encapsulation portion 200 is changed to the filler, the counter substrate 300 may be combined with the filler, in this case, the counter substrate 300 may be made of a plastic material, a glass material, or a metal material.

The organic light emitting display apparatus or display panel 10 according to an embodiment of the present disclosure may further include a polarizing member 400.

The polarizing member 400 may be configured to block the external light reflected by the light extracting portion 140 and the pixel circuit, or the like. For example, the polarizing member 400 may be a circular polarizing member or a circular polarizing film. The polarizing member 400 may be disposed at or coupled to the light extraction surface 100*a* of the substrate 100 by using a coupling member (or a transparent adhesive member) 450. For example, the polarizing member 400 may be omitted.

As described above, the organic light emitting display apparatus or display panel 10 according to an embodiment of the present disclosure includes the light extracting portion 140 disposed or configured at the emission area EA of the subpixel SP, thereby improving light extraction efficiency by changing a path of light generated from the emission layer EL by the light extracting portion 140. Thus, it is possible to realize high efficiency and high luminance so that the lifespan of the emission layer may be extended, and low power consumption may be realized.

Figure 4:
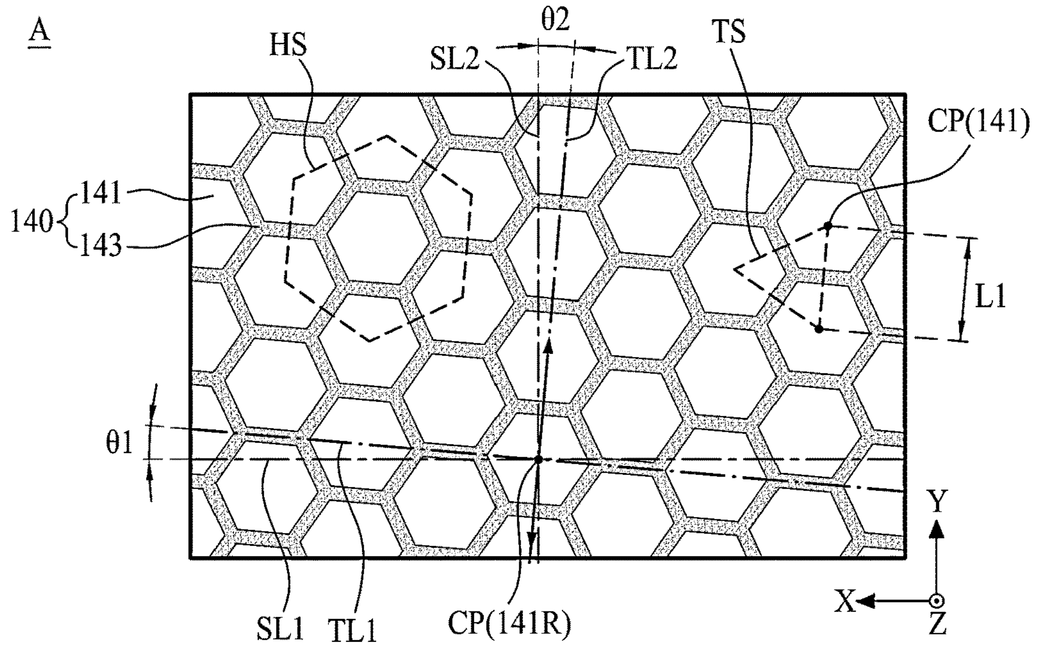
FIG. 4 is an enlarged view of a region 'A' illustrated in FIG. 2.

FIG. 4 is an enlarged view of a region 'A' illustrated in FIG. 2. FIG. 4 is a diagram for describing a planar structure of a rotation structure of a light extraction pattern according to an embodiment of the present disclosure.

Referring to FIGS. 2 and 4, in the light extraction pattern 140 or the first to fourth light extraction patterns 140*a*, 140*b*, 140*c*, and 140*d* according to an embodiment of the present disclosure, each of the plurality of concave portions 141 may be disposed in parallel to have a predetermined interval along a first direction X and may be arranged to be staggered with one another along a second direction Y crossing the first direction X. For example, the plurality of concave portions 141 disposed along the second direction Y may be positioned or aligned at a zigzag line ZL having a zigzag shape along the first direction X (or the second direction Y). Thus, the light extraction pattern 140 may include a larger number of concave portions 141 per unit area, thereby increasing the external extraction efficiency of the light emitted from the light emitting device layer 160.

According to an embodiment of the present disclosure, pitches (or intervals) L1 between a plurality of concave portions 141 disposed in each of first to fourth subpixels SP1 to SP4 configuring one pixel P may be equal to one another. The pitch L1 between the plurality of concave portions 141 may be a distance (or an interval) between the center portions of the two adjacent concave portions 141.

According to an embodiment of the present disclosure, a center portion CP of each of the adjacent three concave portions 141 may form a triangular shape TS. In addition, a center portion CP of six concave portions 141, which are disposed at a periphery of one concave portion 141 or surrounds one concave portion 141, may be connected with one another to one-dimensionally form a hexagonal shape HS. An outer periphery of each of the plurality of concave portions 141 may be disposed or may have in a honeycomb structure, a hexagonal structure, or a circular structure.

The convex portion 143 may be formed to surround each of the plurality of concave portions 141. For example, the convex portion 143 may be configured to individually surround each of the plurality of concave portions 141. Accordingly, the planarization layer 130 overlapping the emission area EA may include a plurality of concave portions 141 surrounded by the convex portions 143. For example, the convex portion 143 surrounding one concave portion 141 may have a square shape, a honeycomb shape, or a circle shape in two-dimensions (or in a plan view) according to the arrangement structure of each of the plurality of concave portions 141.

The light extraction pattern 140 may be configured to rotate (or horizontally rotate) or reversely rotate (or horizontally and reversely rotate) with respect to an arbitrary reference point, within an emission area EA (or a subpixel area) of each of the first to fourth subpixels SP1, SP2, SP3, and SP4. For example, when the concave portion 141 or the convex portions 143 has a planar structure having a hexagonal shape (or a honeycomb shape), a rotation angle of the light extraction pattern 140 may be set to within a range of 0 degrees to 60 degrees. For example, the arbitrary reference point may be an arbitrary position within the emission area EA (or a subpixel area) of each of the first to fourth subpixels SP1, SP2, SP3, and SP4 in the pixel P, or may be a center portion CP or an end of any one of the plurality of concave portions 141.

According to an embodiment of the present disclosure, when the concave portion 141 or the convex portions 143 has a planar structure having a hexagonal shape (or a honeycomb shape), a case where the light extraction pattern 140 rotates by 60 degrees, 120 degrees, 180 degrees, 240 degrees, 300 degrees, or 360 degrees with respect to the arbitrary reference point may be configured to be equal to a case where the light extraction pattern 140 does not rotate with respect to the arbitrary reference point. Accordingly, when the concave portion 141 has a planar structure having a hexagonal shape (or a honeycomb shape), a rotation angle of the light extraction pattern 140 may be greater than 0 degrees and less than 60 degrees.

According to a rotation structure (or rotation arrangement) of the light extraction pattern 140, when a center portion CP of an arbitrary reference concave portion 141R of a plurality of concave portions 141 disposed along a first direction X is positioned at or aligned with a first straight line SL1 parallel to the first direction X, a center portion CP of each of a plurality of other concave portions 141 adjacent to the reference concave portion 141R may not be positioned at or aligned with the first straight line SL1.

According to a rotation structure (or rotation arrangement) of the light extraction pattern 140, when a center portion CP of an arbitrary reference concave portion 141R of a plurality of concave portions 141 disposed along a second direction Y is positioned at or aligned with a second straight line SL2 parallel to the second direction Y, a center portion CP of each of a plurality of other concave portions 141 adjacent to the reference concave portion 141R may not be positioned at or aligned with the second straight line SL2.

According to an embodiment of the present disclosure, the center portion CP of each of the plurality of concave portions 141 disposed at the first direction X may be positioned or aligned at the first tilt line TL1 intersecting with the first straight line SL1. Furthermore, the center portion CP of each of the plurality of concave portions 141 disposed at the second direction Y may be positioned or aligned at the second tilt line TL2 intersecting with the second straight line SL2.

The first tilt line TL1 may be sloped or inclined by a first angle $\theta 1$ from the first straight line SL1. For example, the first angle $\theta 1$ may be more than 0 degrees and less than 60 degrees (0 degrees$\leq\theta 1<$60 degrees) or greater than 0 degrees and smaller than 60 degrees (0 degrees$<\theta 1\leq$60 degrees). The first tilt line TL1 according to an embodiment of the present disclosure may be sloped or inclined from the first straight line SL1 and may pass through a center portion CP of rotated concave portions 141, and thus, the first tilt line TL1 may be a first center connection line or a first center extension line. The first tilt line TL1 according to another embodiment of the present disclosure may be sloped or inclined from the first straight line SL1 and may pass through ends of rotated concave portions 141, and thus, the first tilt line TL1 may be a first end connection line or a first end extension line.

According to an embodiment of the present disclosure, when the plurality of concave portions 141 are arranged in a honeycomb structure, the first tilt line TL1 according to an embodiment of the present disclosure may be sloped or inclined from the first straight line SL1 and may pass through two vertexes facing each other and a center portion CP at each of the plurality of concave portions 141. Furthermore, the first tilt line TL1 according to another embodiment of the present disclosure may be sloped or inclined from the first straight line SL1 and may pass through any one of first to sixth sides of each of the plurality of concave portions 141. For example, an angle between the first tilt line TL1 and a side intersecting with the first tilt line TL1 among the first to sixth sides of each of the plurality of concave portions 141 may be 60 degrees.

The second tilt line TL2 may be sloped or inclined by a second angle θ2 from a second straight line SL2. For example, the second angle θ2 may be more than 0 degrees and less than 60 degrees (0 degrees≤θ2<60 degrees) or greater than 0 degrees and smaller than 60 degrees (0 degrees<θ2≤60 degrees). For example, the second angle θ2 may be equal to a first angle θ1. The second tilt line TL2 according to an embodiment of the present disclosure may be sloped or inclined from the second straight line SL2 and may pass through a center portion CP of rotated concave portions 141, and thus, the second tilt line TL2 may be a second center connection line or a second center extension line. The second tilt line TL2 according to another embodiment of the present disclosure may be sloped or inclined from the second straight line SL2 and may pass through ends of rotated concave portions 141, and thus, the second tilt line TL2 may be a second end connection line or a second end extension line.

According to an embodiment of the present disclosure, when the plurality of concave portions 141 are arranged in a honeycomb structure, the second tilt line TL2 according to an embodiment of the present disclosure may be sloped or inclined from the second straight line SL2 and may pass through the center portion CP and a center of each of two sides facing each other in each of the plurality of concave portions 141. Furthermore, the second tilt line TL2 according to another embodiment of the present disclosure may be sloped or inclined from the second straight line SL2 and may pass through one of first to sixth vertexes of each of the plurality of concave portions 141. For example, an angle between the second tilt line TL2 and a side intersecting with the second tilt line TL2 among the first to sixth sides of each of the plurality of concave portions 141 may be 30 degrees or 90 degrees.

According to an embodiment of the present disclosure, external light incident on the light extraction pattern 140 may decrease more in output angle than an incident angle as a refractive index of a planarization layer 130 increases, and thus, the amount of light reflected twice from the light extraction pattern 140 or a convex portion 143 may increase, whereby a reflectance (or the amount of reflection) of external light may increase to increase a black color (or black rising) phenomenon or a reflection visibility characteristic may be reduced. For example, when the refractive index of the planarization layer 130 where the light extraction pattern 140 is formed is 1.57 or more, a black color (or black rising) phenomenon may increase. Accordingly, the planarization layer 130 according to an embodiment of the present disclosure may be formed to have a refractive index of less than 1.57 or have a refractive index similar to that of the substrate 100, and thus, an output angle may be greater than an incident angle of external light incident on the light extraction pattern 140, thereby decreasing a reflectance (or the amount of reflection) of external light to reduce a black color (or black rising) phenomenon or improve a reflection visibility characteristic.

Figure 5:
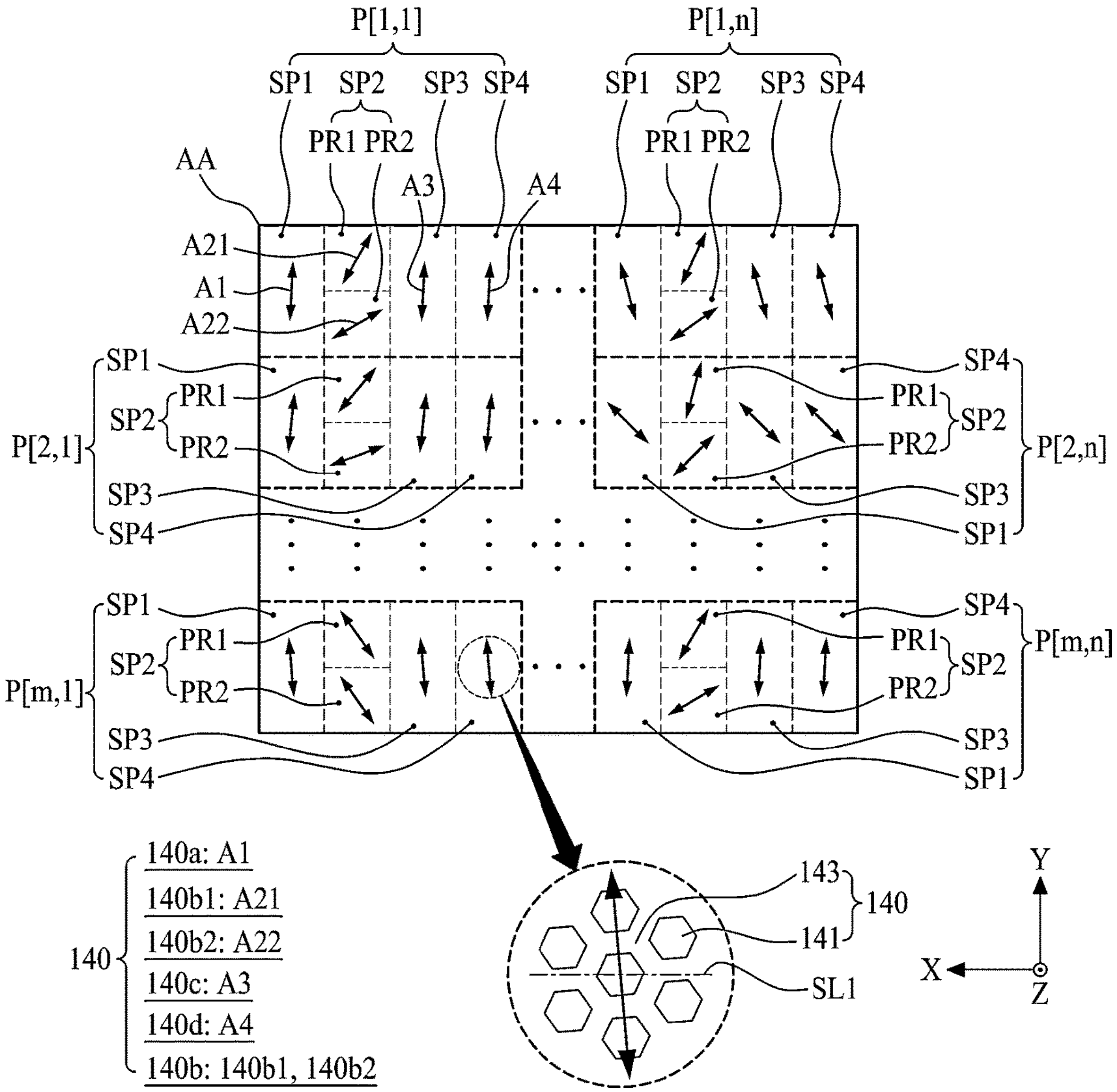
FIG. 5 is a diagram illustrating a rotation structure of a light extraction pattern according to an embodiment of the present disclosure.

FIG. 5 is a diagram illustrating a rotation structure of a light extraction pattern according to an embodiment of the present disclosure. A bidirectional arrow illustrated in FIG. 5 represents a rotation angle (or a rotation direction) of the light extraction pattern.

Referring to FIG. 5, in an organic light emitting display apparatus according to an embodiment of the present disclosure, a display area AA may include a plurality of pixels P[1,1] to P[m,n] each including first to fourth subpixels SP1, SP2, SP3, and SP4 arranged in a first direction X and a second direction Y and light extraction patterns 140 respectively provided in the first to fourth subpixels SP1, SP2, SP3, and SP4 of each of the plurality of pixels P[1,1] to P[m,n].

In each of the plurality of pixels P[1,1] to P[m,n], each of the first, third, and fourth subpixels SP1, SP3, and SP4 may include one pattern region, and the second subpixel SP2 may include a first pattern region PR1 and a second pattern region PR2.

The light extraction patterns 140 may be rotated by rotation angles A1, A21, A22, A3, and A4 which are previously set at each of the first to fourth subpixels SP1, SP2, SP3, and SP4 configured at each of the plurality of pixels P[1,1] to P[m,n]. The light extraction patterns 140 configured at each of the first to fourth subpixels SP1, SP2, SP3, and SP4 may be rotated by different rotation angles A1, A21, A22, A3, and A4 by pixels P[1,1] to P[m,n] units. For example, some of the light extraction patterns 140 may be rotated by a same rotation angles A1, A21, A22, A3, and A4, based on the number of pixels P disposed at the display area AA. For example, the light extraction patterns 140 which have rotated by a same rotation angles A1, A21, A22, A3, and A4 may be separated from one another by an interval corresponding to the plurality of pixels P[1,1] to P[m,n], in the display area AA.

According to an embodiment of the present disclosure, the light extraction pattern 140 at one or more of the plurality of subpixels SP may have rotated by an angle different from that of the light extraction pattern 140 at each of the other subpixels SP. For example, the light extraction patterns 140 at each of the first, third, and fourth subpixels SP1, SP3, and SP4 may be rotated or reversely rotated by a same angle with respect to a reference point. The second light extraction pattern 140*b* may be rotated or reversely rotated by an angle which differs from the light extraction patterns 140 at each of the first, third, and fourth subpixels SP1, SP3, and SP4. For example, when the light extraction patterns 140 has a planar structure having a hexagonal shape (or a honeycomb shape), the light extraction patterns 140 at each of the first, third, and fourth subpixels SP1, SP3, and SP4 may be rotated by angles more than 0 degrees and less than 60 degrees with respect to the reference point. The light extraction patterns 140 at the second subpixel SP2 may be rotated by angles more than 0 degrees and less than 60 degrees with respect to the reference point.

The light extraction pattern 140 according to a first embodiment of the present disclosure may include a first light extraction pattern 140*a* at the first subpixel SP1, a second light extraction pattern 140*b* at the second subpixel SP2, a third light extraction pattern 140*c* at the third subpixel SP3, and a fourth light extraction pattern 140*d* at the fourth subpixel SP1.

The first light extraction pattern 140*a* may rotate or reversely rotate by a first rotation angle A1 with respect to a reference point within the first subpixel SP1.

The second light extraction pattern 140*b* may include a first sub light extraction pattern 140*b*1 configured at the first pattern region PR1 of the second subpixel SP2 and a second sub light extraction pattern 140*b*2 configured at the second pattern region PR2 of the second subpixel SP2.

Each of the first sub light extraction pattern 140*b*1 and the second sub light extraction pattern 140*b*2 may include the plurality of concave portions 141 and the convex portion 143 between the plurality of concave portions 141, described above with reference to FIG. 2, and thus, repeated descriptions thereof are omitted. The first sub light extraction pattern (or a 2-1 sub light extraction pattern) 140*b*1 may be rotated or reversely rotated by a first sub rotation angle (or a 2-1 rotation angle) A21 with respect to a reference point within the first pattern region PR1. The second sub light extraction pattern (or a 2-2 sub light extraction pattern) 140*b*2 may be rotated or reversely rotated by a second sub rotation angle (or a 2-2 rotation angle) A22 with respect to a reference point within the second pattern region PR2.

The third light extraction pattern 140*c* may rotate or reversely rotate by a third rotation angle A3 with respect to a reference point within the third subpixel SP3.

The fourth light extraction pattern 140*d* may rotate or reversely rotate by a fourth rotation angle A4 with respect to a reference point within the fourth subpixel SP4.

Rotation angles A1, A21, A22, A3, and A4 of light extraction patterns 140 respectively configured at the first to fourth subpixels SP1, SP2, SP3, and SP4 by pixels P[1,1] to P[m,n] units may be set so that maximum irregularity (or randomness) is provided and regularity is minimized within the display area AA. For example, the rotation angles A1, A21, A22, A3, and A4 of light extraction patterns 140 respectively configured at the first to fourth subpixels SP1, SP2, SP3, and SP4 by pixels P[1,1] to P[m,n] units may be different to have minimum regularity, for easiness of a design.

In each of the plurality of pixels P[1,1] to P[m,n], a first rotation angle A1, a third rotation angle A3, and a fourth rotation angle A4 may be equal to one another. A first sub rotation angle A21 and a second rotation angle A22 may differ from each of the first rotation angle A1, the third rotation angle A3, and the fourth rotation angle A4. The first sub rotation angle A21 and a second rotation angle A22 may differ. For example, the first rotation angle A1, the third rotation angle A3, and the fourth rotation angle A4 for each pixel may differ to have greater irregularity or regularity. For example, the first sub rotation angle A21 and a second rotation angle A22 for each pixel P may differ to have greater irregularity or regularity.

According to an embodiment of the present disclosure, the first sub light extraction pattern 140*b*1 and the second sub light extraction pattern 140*b*2 may be configured with different rotation angles, and thus, reflection light reflected by the first sub light extraction pattern 140*b*1 and reflection light reflected by the second sub light extraction pattern 140*b*2 may have different diffraction characteristics and different regularities. Therefore, reflection light reflected by the second light extraction pattern 140*b* configured at the second subpixel SP2 may decrease in regularity or may increase in randomness, and thus, a probability of the occurrence of constructive interference may be reduced by reflection light reflected from the second subpixel SP2. Accordingly, the occurrence of rainbow Mura spread in a radial shape and/or circular ring Mura spread in a radial shape may be prevented or minimized by a diffraction characteristic of reflection light reflected from the light extraction pattern 140 of the display area AA.

According to an embodiment of the present disclosure, the light extraction pattern 140 configured at one of the pixels P[1,1] to P[m,n] may be rotated based on a plurality of (e.g. three) rotation angles. A plurality of (e.g. three) different rotation angles may be allocated to the light extraction pattern 140 at each of the plurality of pixels P[1,1] to P[m,n].

According to an embodiment of the present disclosure, when the light extraction pattern 140 has a planar structure having a hexagonal shape (or a honeycomb shape), each of the first rotation angle A1, the third rotation angle A3, and the fourth rotation angle A4 may be one of angles of more than 0 degrees and less than 60 degrees with respect to a reference point. The first rotation angle A1 of the first light extraction pattern 140*a* configured at each of the plurality of pixels P[1,1] to P[m,n] may differ within a range of more than 0 degrees and less than 60 degrees. Some of the light extraction patterns 140 configured at each of the plurality of pixels P may have the same rotation angle, and the light extraction patterns 140 having the same rotation angles may be spaced apart from one another by an interval corresponding to the plurality of pixels P. For example, some of the first light extraction patterns 140*a* configured at each of the plurality of pixels P[1,1] to P[m,n] may have a same first rotation angle A1, and first light extraction patterns 140*a* having a same first rotation angles A1 may be spaced apart from one another by an interval corresponding to a plurality of or two or more pixels P[1,1] to P[m,n]. In each of the plurality of pixels P[1,1] to P[m,n], the third rotation angle A3 of the third light extraction pattern 140*c* may be a same as the first rotation angle A1 of the first light extraction pattern 140*a*, and the fourth rotation angle A4 of the fourth light extraction pattern 140*d* may be a same as the first rotation angle A1 of the first light extraction pattern 140*a*.

According to an embodiment of the present disclosure, when the light extraction pattern 140 has a planar structure having a hexagonal shape (or a honeycomb shape), the first sub rotation angle A2 may be one angle different from the first rotation angle A1 of angles of more than 0 degrees and less than 60 degrees with respect to the reference point. The second sub rotation angle A22 may be one angle different from each of the first rotation angle A1 and the first sub rotation angle A21 of the angles of more than 0 degrees and less than 60 degrees with respect to the reference point. For example, a difference between the first sub rotation angle A21 and the second sub rotation angle A22 may be a maximum of 30 degrees, and in this case, a rotation angle of reflected light by each of the first sub light extraction pattern 140*b*1 and the second sub light extraction pattern 140*b*2 may be maximized. For example, rotation angles of light extraction patterns 140 disposed at a same adjacent pixels P[1,1] to P[m,n] may have a maximum of 30-degree difference therebetween, but embodiments according to the present disclosure are not limited thereto.

According to an embodiment of the present disclosure, when the light extraction pattern 140 has a planar structure having a hexagonal shape (or a honeycomb shape), 3 degrees, 30 degrees, and 60 degrees may be allocated to a 1×1 (or $1^{st}$ row, $1^{st}$ column) pixel P[1,1] illustrated in FIG. 5, and in this case, each of the first rotation angle A1, the third rotation angle A3, and the fourth rotation angle A4 may be 3 degrees, the first sub rotation angle A21 may be 30 degrees, and the second sub rotation angle A22 may be 60 degrees. For example, 6 degrees, 40 degrees, and 70 degrees may be allocated to a 2×1 (or $2^{nd}$ row, $1^{st}$ column) pixel P[2,1] illustrated in FIG. 5, and in this case, each of the first rotation angle A1, the third rotation angle A3, and the fourth rotation angle A4 may be 6 degrees, the first sub rotation angle A21 may be 40 degrees, and the second sub rotation angle A22 may be 70 degrees. For example, 3 degrees, 30 degrees, and 60 degrees may be allocated to a m×n (or $m^{th}$ row, $n^{th}$ column) pixel P[m,n] illustrated in FIG. 5, and in this case, each of the first rotation angle A1, the third rotation angle A3, and the fourth rotation angle A4 may be 3 degrees, the first sub rotation angle A21 may be 30 degrees, and the second sub rotation angle A22 may be 60 degrees. Therefore, rotation angles A1, A21, A22, A3, and A4 of the light extraction pattern 140 provided in an m×n pixel P[m,n] may be a same as rotation angles A1, A21, A22, A3, and A4 of the light extraction pattern 140 provided in the 1×1 pixel P[1,1], but the m×n pixel P[m,n] and the 1×1 pixel P[1,1] may have a maximum separation distance therebetween, and thus, light interference between reflection lights respectively reflected from the m×n pixel P[m,n] and the 1×1 pixel P[1,1] may not occur.

In an organic light emitting display apparatus or a display panel including the light extraction pattern 140 according to the first embodiment of the present disclosure, the second subpixel SP2 of each of the plurality of pixels P[1,1] to P[m,n] may include the first sub light extraction pattern **140*b*1 and the second sub light extraction pattern 140*b*2 of the second light extraction pattern 140*b* which have rotated by different angles, and thus, the irregularity or randomness of a diffraction pattern of reflected light based on a rotation angle of each of the first sub light extraction pattern 140*b*1 and the second sub light extraction pattern 140*b*2** may increase, thereby preventing or minimized the occurrence of rainbow Mura where reflected light is spread in a radial shape and/or circular ring Mura where reflected light is spread in a radial shape. Accordingly, a black visibility characteristic or a black color (or black rising) phenomenon caused by the reflection of external light may be reduced in a non-driving or off state, thereby implementing real black.

Figure 6A:
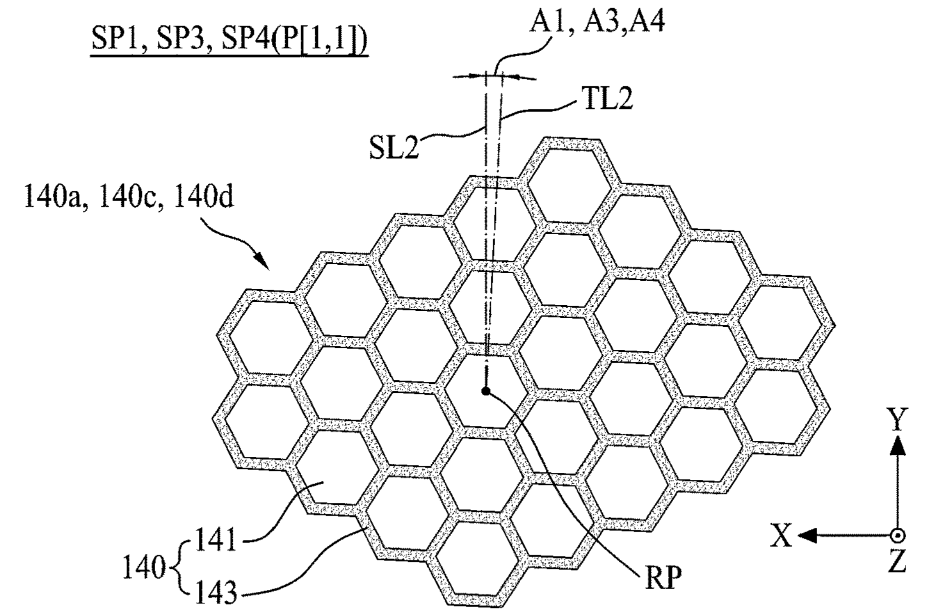
FIG. 6A is a diagram illustrating first, third, and fourth light extraction patterns according to an embodiment of the present disclosure.
Figure 6B:
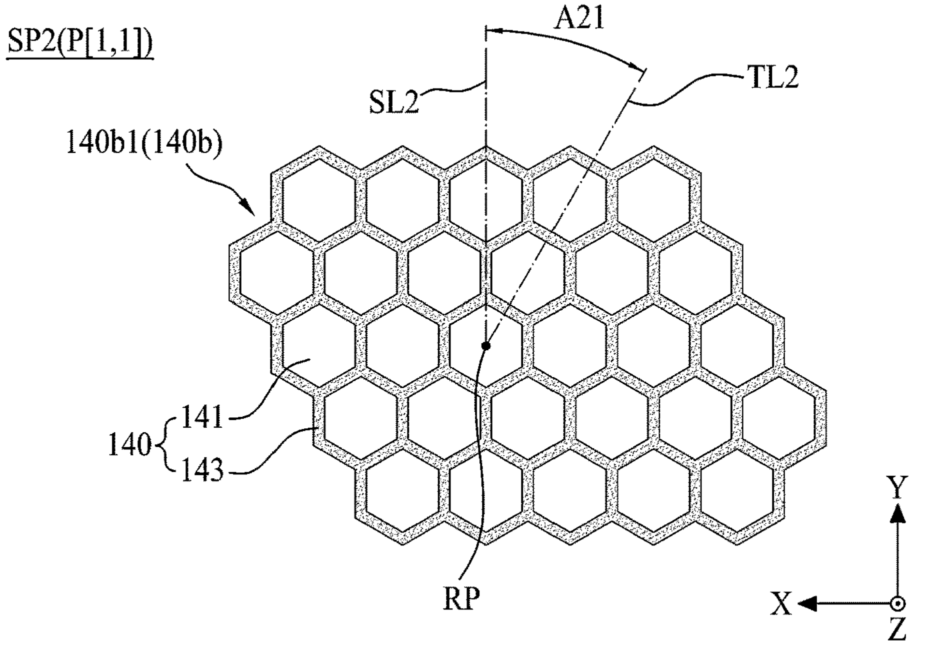
FIG. 6B is a diagram illustrating a first sub light extraction pattern according to an embodiment of the present disclosure.
Figure 6C:
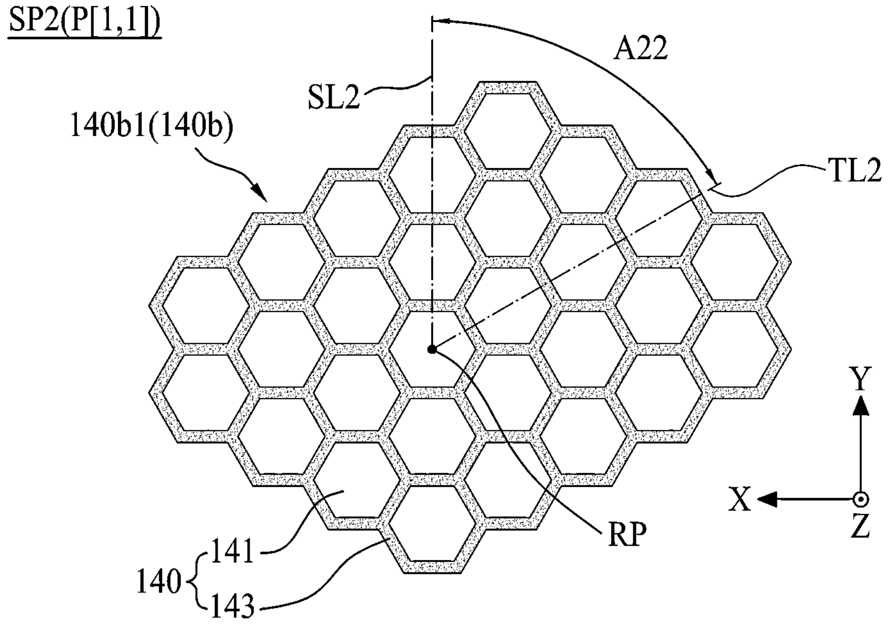
FIG. 6C is a diagram illustrating a second sub light extraction pattern according to an embodiment of the present disclosure.

FIG. 6A is a diagram illustrating first, third, and fourth light extraction patterns in the 1×1 (or $1^{st}$ row, $1^{st}$ column) pixel illustrated in FIG. 5, FIG. 6B is a diagram illustrating a first sub pattern of a second light extraction pattern in the 1×1 (or $1^{st}$ row, $1^{st}$ column) pixel illustrated in FIG. 5, and FIG. 6C is a diagram illustrating a second sub pattern of a second light extraction pattern in the 1×1 (or $1^{st}$ row, $1^{st}$ column) pixel illustrated in FIG. 5.

Referring to FIG. 6A, first, third, and fourth light extraction patterns **140*a*, 140*c*, and 140*d* respectively provided at first, third, and fourth subpixels SP1, SP3, and SP4 of a 1×1 (or $1^{st}$ row, $1^{st}$ column) pixel P[1,1] may be respectively rotated by rotation angles A1, A3, and A4 of 3 degrees with respect to an arbitrary reference point RP. For example, the rotation angles A1, A3, and A4 of the first, third, and fourth light extraction patterns 140*a*, 140*c*, and 140*d* may each be an angle between a second straight line SL2 and a second tilt line TL2**.

Referring to FIG. 6B, the first sub light extraction pattern **140*b*1 of the second light extraction pattern 140*b* provided at a second subpixel SP2 of the 1×1 (or $1^{st}$ row, $1^{st}$ column) pixel P[1,1] may be rotated by a first sub rotation angle A21 of 30 degrees with respect to the arbitrary reference point RP. For example, the first sub rotation angle A21 may be an angle between the second straight line SL2 and the second tilt line TL2**.

Referring to FIG. 6C, the second sub light extraction pattern **140*b*2 second light extraction pattern 140*b* provided at a second subpixel SP2 of the 1×1 (or $1^{st}$ row, $1^{st}$ column) pixel P[1,1] may be rotated by a second sub rotation angle A22 of 60 degrees with respect to the arbitrary reference point RP. For example, the second sub rotation angle A22 may be an angle between the second straight line SL2 and the second tilt line TL2**.

Referring to FIGS. 6A to 6C, the first sub rotation angle A21 of the first light extraction pattern **140*b*1 may have a 27-degree difference with the rotation angles A1, A3, and A4 of each of the first, third, and fourth light extraction patterns 140*a*, 140*c*, and 140*d*. The second sub rotation angle A22 of the second light extraction pattern 140*b*2 may have a 57-degree difference with the rotation angles A1, A3, and A4 of each of the first, third, and fourth light extraction patterns 140*a*, 140*c*, and 140*d*. The second sub rotation angle A22 of the second light extraction pattern 140*b*2 may have a 30-degree difference with the first sub rotation angle A21 of the first light extraction pattern 140*b*1**.

Therefore, in the 1×1 (or $1^{st}$ row, $1^{st}$ column) pixel P[1,1], the irregularity or randomness of reflected light may increase based on a rotation angle of each of the second light extraction pattern **140*b* and the first, third, and fourth light extraction patterns 140*a*, 140*c*, and 140*d*, and the irregularity or randomness of reflected light may more increase based on a rotation angle of each of the first sub light extraction pattern 140*b*1 and the second sub light extraction pattern 140*b*2**, thereby preventing or minimizing the occurrence of rainbow Mura where reflected light is spread in a radial shape and/or circular ring Mura where reflected light is spread in a radial shape. Accordingly, a black visibility characteristic or a black color (or black rising) phenomenon caused by the reflection of external light may be reduced in a non-driving or off state, thereby implementing real black.

Figure 7A:
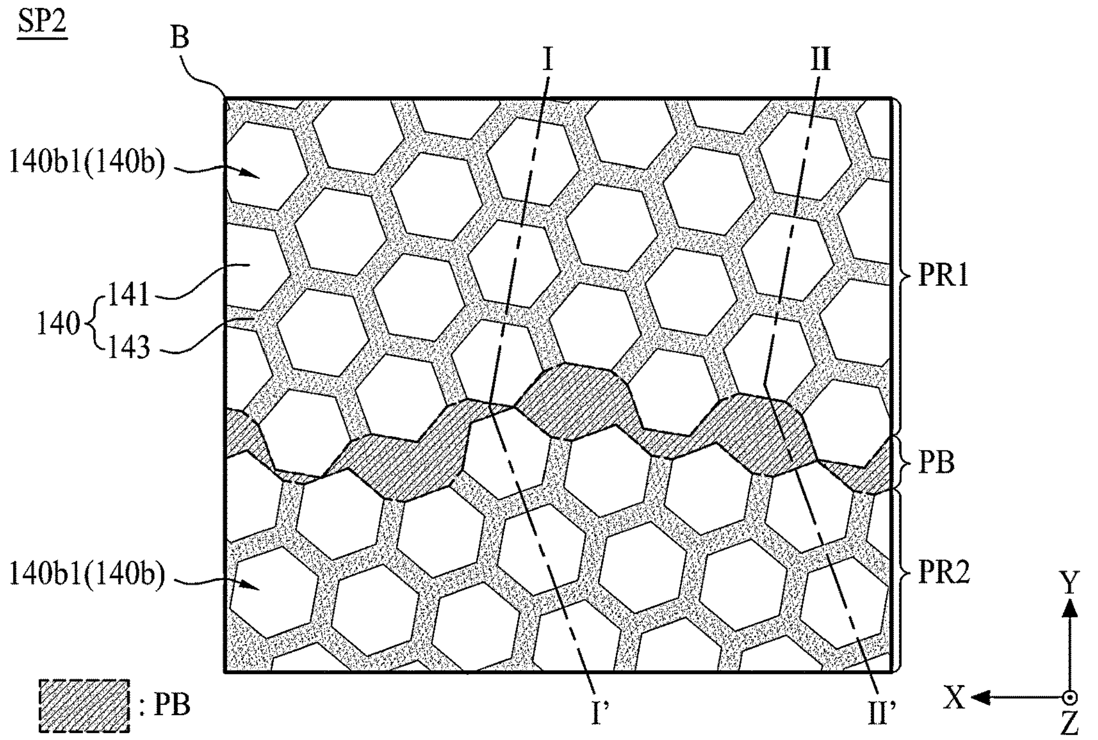
FIG. 7A is an enlarged view of a region 'B' illustrated in FIG. 2.
Figure 7B:
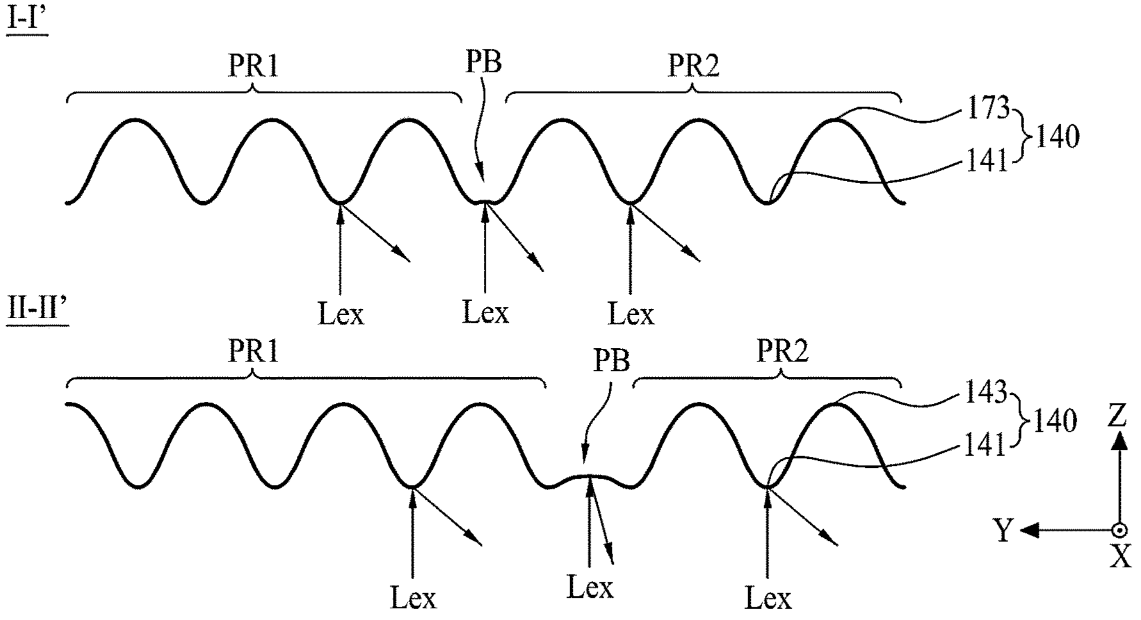
FIG. 7B is a cross-sectional view taken along line I-I' and line II-II' illustrated in FIG. 7A.

FIG. 7A is an enlarged view of a region 'B' illustrated in FIG. 2, and FIG. 7B is a cross-sectional view taken along line I-I' and line II-II' illustrated in FIG. 7A. FIGS. 7A and 7B are diagrams illustrating a boundary portion between first and second pattern regions of a second subpixel SP according to an embodiment of the present disclosure.

Referring to FIGS. 7A and 7B, the second subpixel SP according to an embodiment of the present disclosure may include a boundary portion PB between a plurality of pattern regions (e.g., the first and second pattern regions PR1 and PR2).

A boundary portion (or a pattern boundary portion) PB according to an embodiment of the present disclosure may be a center region of the second subpixel SP, but embodiments of the present disclosure are not limited thereto. The boundary portion PB may be a region between a concave portion 141 disposed at an end of the first pattern region PR1 and a concave portion 141 disposed at an end of the second pattern region PR2. For example, the boundary portion PB may be configured with a convex portion 143 disposed a region between the concave portion 141 disposed at an end of the first pattern region PR1 and the concave portion 141 disposed at an end of the second pattern region PR2. For example, the boundary portion PB (e.g., a convex portion 143 configuring the boundary portion PB) may have an irregular size (or width), based on a distance between the concave portion 141 disposed at the end of the first pattern region PR1 and the concave portion 141 disposed at the end of the second pattern region PR2.

In the boundary portion PB, one or more of a plurality of concave portions 141 disposed at a first sub light extraction pattern **140*b*1 of the first pattern region PR1 may overlap one or more of a plurality of concave portions 141 disposed at a second sub light extraction pattern 140*b*2 of the second pattern region PR2. For example, the concave portion 141 of the first sub light extraction pattern 140*b*1 and the concave portion 141 of the second sub light extraction pattern 140*b*2 overlapping each other in the boundary portion PB may be connected with each other. One or more of the plurality of concave portions 141 disposed at the first sub light extraction pattern 140*b*1 of the first pattern region PR1 may be spaced apart from one or more of the plurality of concave portions 141 disposed at the second sub light extraction pattern 140*b*2 of the second pattern region PR2. For example, a shortest distance between the concave portion 141 of the first sub light extraction pattern 140*b*1 and the concave portion 141 of the second sub light extraction pattern 140*b*2 which are spaced apart from each other in the boundary portion PB along a second direction Y may differ from each other. Accordingly, the boundary portion PB may be configured with the convex portion 143 which has an irregular size (or width) between the concave portion 141 of the first sub light extraction pattern 140*b*1 and the concave portion 141 of the second sub light extraction pattern 140*b*2**.

The boundary portion PB or the convex portion 143 disposed at the boundary portion PB may have an irregular shape, and thus, reflection light Lex reflected from the boundary portion PB may have an irregular diffraction characteristic. Accordingly, diffraction characteristics of reflection lights Lex respectively reflected from the first sub light extraction pattern **140*b*1, the second sub light extraction pattern 140*b*2, and the boundary portion PB may differ, and thus, constructive interference between the reflection lights Lex respectively reflected from the first sub light extraction pattern 140*b*1, the second sub light extraction pattern 140*b*2**, and the boundary portion PB may be minimized or prevented, thereby increasing a probability of occurrence of destructive interference.

Figure 8:
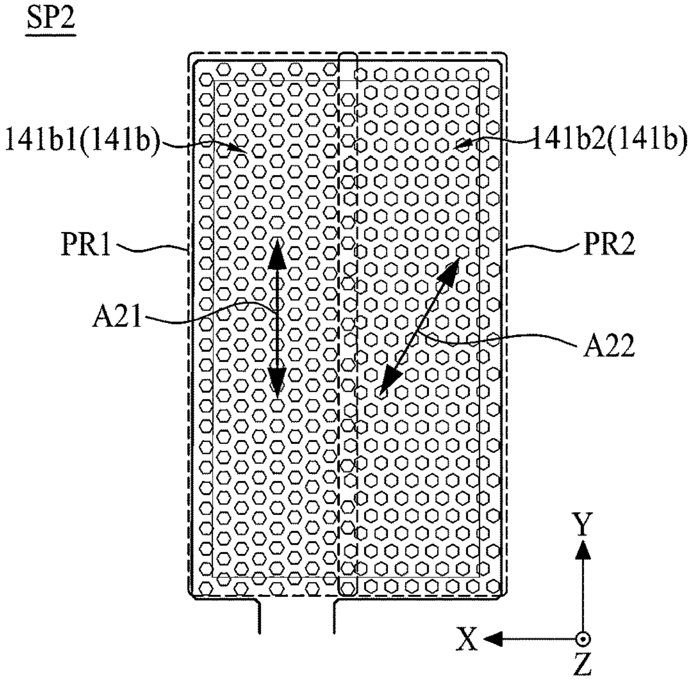
FIG. 8 is a diagram illustrating a light extraction pattern of a second subpixel according to another embodiment of the present disclosure.

FIG. 8 is a diagram illustrating a light extraction pattern of a second subpixel according to another embodiment of the present disclosure. FIG. 8 illustrates an embodiment implemented by modifying the pattern region of the second subpixel illustrated in FIGS. 2 and 5.

Referring to FIGS. 5 and 8, a second subpixel SP2 according to another embodiment (or a second embodiment) of the present disclosure may include a first pattern region PR1 and a second pattern region PR2.

The first pattern region PR1 and the second pattern region PR2 may be separated or spatially separated from each other within the second subpixel SP2. The first pattern region PR1 and the second pattern region PR2 may be disposed in parallel along a first direction X within the second subpixel SP2. For example, each of the first pattern region PR1 and the second pattern region PR2 may have a rectangular shape which extends along a second direction Y. For example, the first pattern region PR1 may be a left region of the second subpixel SP2, and the second pattern region PR2 may be a right region of the second subpixel SP2. For example, the second subpixel SP2 may have a left-right two-division structure (or a horizontal two-division tetragonal structure) by the first pattern region PR1 and the second pattern region PR2. For example, the first pattern region PR1 and the second pattern region PR2 may have a same size (or area), but embodiments of the present disclosure are not limited thereto.

The second light extraction pattern **140*b* disposed at the second subpixel SP2 may include a first sub light extraction pattern 140*b*1 and a second sub light extraction pattern 140*b*2**.

The first sub light extraction pattern **140*b*1 may be formed or configured at the first pattern region PR1. The first sub light extraction pattern 140*b*1 may be rotated or reversely rotated with respect to a reference point within the first pattern region PR1. For example, when the first sub light extraction pattern 140*b*1 has a planar structure having a hexagonal shape (a honeycomb shape), the first sub light extraction pattern 140*b*1 may be rotated by a first sub rotation angle A21 which is greater than 0 degrees and less than 60 degrees with respect to a reference point in the first pattern region PR1. For example, the first sub rotation angle A21 of the first sub light extraction pattern 140*b*1 illustrated in FIG. 8** may be 0 degrees, but embodiments of the present disclosure are not limited thereto.

The second sub light extraction pattern **140*b*2 may be formed or configured at the second pattern region PR2. The second sub light extraction pattern 140*b*2 may be rotated or reversely rotated with respect to a reference point within the second pattern region PR2. For example, when the second sub light extraction pattern 140*b*2 has a planar structure having a hexagonal shape (a honeycomb shape), the second sub light extraction pattern 140*b*2 may rotate by a second sub rotation angle A22 which is greater than 0 degrees and less than 60 degrees with respect to a reference point within the second pattern region PR2. For example, a difference between the first sub rotation angle A21 and the second sub rotation angle A22 may be a maximum of 30 degrees. For example, the second sub rotation angle A22 of the second sub light extraction pattern 140*b*2 illustrated in FIG. 8** may be 30 degrees, but embodiments of the present disclosure are not limited thereto.

In the second subpixel SP2, a boundary portion between the first pattern region PR1 and the second pattern region PR2 may include a convex portion 143 having an irregular shape, and thus, reflection light reflected by the convex portion 143 of the boundary portion may have an irregular diffraction characteristic.

The second subpixel SP2 according to another embodiment of the present disclosure may include the first sub light extraction pattern **140*b*1 and the second sub light extraction pattern 140*b*2, which have different angles A21 and A22, and thus, the regularity of reflected light (particularly, white reflected light) may more decrease or the randomness thereof may more increase. Accordingly, a probability of occurrence of constructive interference between reflection lights reflected by light extraction patterns 140** disposed at pixels may more decrease, or a probability of occurrence of destructive interference may more increase.

Figure 9:
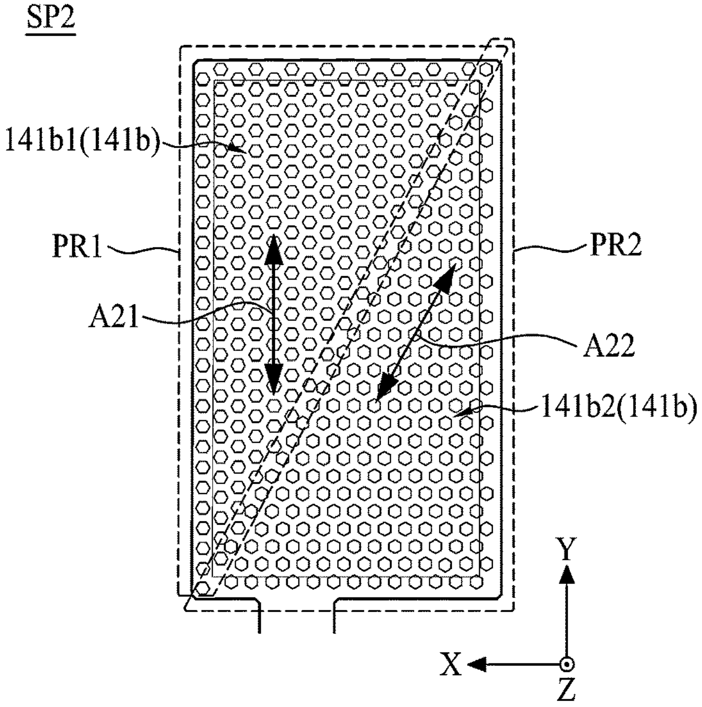
FIG. 9 is a diagram illustrating a light extraction pattern of a second subpixel according to another embodiment of the present disclosure.

FIG. 9 is a diagram illustrating a light extraction pattern of a second subpixel according to another embodiment of the present disclosure. FIG. 9 illustrates an embodiment implemented by modifying the pattern region of the second subpixel illustrated in FIGS. 2, 5, and 8.

Referring to FIGS. 5 and 9, a second subpixel SP2 according to another embodiment (or a third embodiment) of the present disclosure may include a first pattern region PR1 and a second pattern region PR2.

The first pattern region PR1 and the second pattern region PR2 may be separated or spatially separated from each other within the second subpixel SP2. The first pattern region PR1 and the second pattern region PR2 may be disposed in parallel along a diagonal direction between a first direction X and a second direction Y within the second subpixel SP2.

For example, each of the first pattern region PR1 and the second pattern region PR2 may have a triangular shape. For example, the second subpixel SP2 may have a diagonal division structure (or a two-division triangular structure) by the first pattern region PR1 and the second pattern region PR2. For example, the first pattern region PR1 and the second pattern region PR2 may have a same size (or area), but embodiments of the present disclosure are not limited thereto.

A second light extraction pattern **140*b* disposed in the second subpixel SP2 may include a first sub light extraction pattern 140*b*1 disposed in the first pattern region PR1 and a second sub light extraction pattern 140*b*2 disposed in the second pattern region PR2. Except for that the first sub light extraction pattern 140*b*1 and the second sub light extraction pattern 140*b*2 are respectively disposed in the first pattern region PR1 and the second pattern region PR2 of the second subpixel SP2 having the diagonal division structure, the first sub light extraction pattern 140*b*1 and the second sub light extraction pattern 140*b*2 may be a same as the first sub light extraction pattern 140*b*1 and the second sub light extraction pattern 140*b*2 described above with reference to FIG. 5 or 8**, and thus, repeated descriptions thereof are omitted.

In the second subpixel SP2, a boundary portion between the first pattern region PR1 and the second pattern region PR2 may include a convex portion 143 having an irregular shape, and thus, reflection light reflected by the convex portion 143 of the boundary portion may have an irregular diffraction characteristic.

The second subpixel SP2 according to another embodiment of the present disclosure may include the first sub light extraction pattern **140*b*1 and the second sub light extraction pattern 140*b*2, which have different angles A21 and A22, and thus, the regularity of reflected light (particularly, white reflected light) may more decrease or the randomness thereof may more increase. Accordingly, a probability of occurrence of constructive interference between reflection lights reflected by light extraction patterns 140** disposed at pixels may more decrease, or a probability of occurrence of destructive interference may more increase.

Figure 10:
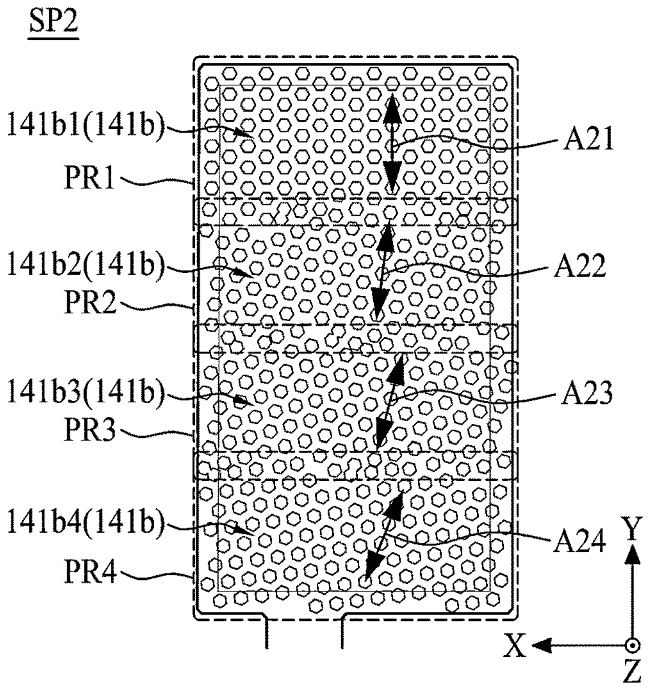
FIG. 10 is a diagram illustrating a light extraction pattern of a second subpixel according to another embodiment of the present disclosure.

FIG. 10 is a diagram illustrating a light extraction pattern of a second subpixel according to another embodiment of the present disclosure. FIG. 10 illustrates an embodiment implemented by modifying the pattern region of the second subpixel illustrated in FIGS. 2 and 5.

Referring to FIGS. 5 and 10, one or more of the plurality of the subpixels SP according to another embodiment (or a fourth embodiment) of the present disclosure may include first to fourth pattern regions. For example, a second subpixel SP2 according to another embodiment of the present disclosure may include first to fourth pattern regions PR1, PR2, PR3, and PR4.

The first to fourth pattern regions PR1, PR2, PR3, and PR4 may be separated or spatially separated from each other within the second subpixel SP2. The first to fourth pattern regions PR1, PR2, PR3, and PR4 may be disposed in parallel along a second direction Y within the second subpixel SP2. For example, each of the first to fourth pattern regions PR1, PR2, PR3, and PR4 may have a rectangular shape which extends along a first direction X. For example, the second subpixel SP2 may have an upward-downward four-division structure (or a vertical four-division tetragonal structure) by the first to fourth pattern regions PR1, PR2, PR3, and PR4. The first to fourth pattern regions PR1, PR2, PR3, and PR4 may have a same size (or area), but embodiments of the present disclosure are not limited thereto.

The second light extraction pattern **140*b* disposed at the second subpixel SP2 may include a first sub light extraction pattern 140*b*1 disposed at the first pattern region PR1, a second sub light extraction pattern 140*b*2 disposed at the second pattern region PR2, a third sub light extraction pattern 140*b*3 disposed at the third pattern region PR3, and a fourth sub light extraction pattern 140*b*4 disposed at the fourth pattern region PR4**.

First to fourth sub light extraction patterns **140*b*1, 140*b*2, 140*b*3, and 140*b*4 may be rotated or reversely rotated by different rotation angles A21, A22, A23, and A24 with respect to a reference point in corresponding pattern regions PR1, PR2, PR3, and PR4. The first to fourth sub light extraction patterns 140*b*1, 140*b*2, 140*b*3, and 140*b*4 may be rotated by different angles. For example, an angle difference between rotation angles of the first to fourth sub light extraction patterns 140*b*1, 140*b*2, 140*b*3, and 140*b*4 at each of the first to fourth pattern regions PR1, PR2, PR3, and PR4, respectively, may be a maximum of 15 degrees. Accordingly, the regularity of reflection lights reflected by the first to fourth sub light extraction patterns 140*b*1, 140*b*2, 140*b*3, and 140*b*4 in the second subpixel SP2** may more decrease or the randomness thereof may more increase.

According to an embodiment of the present disclosure, when the first to fourth sub light extraction patterns **140*b*1, 140*b*2, 140*b*3, and 140*b*4 has a planar structure having a hexagonal shape (a honeycomb shape), the first to fourth sub light extraction patterns 140*b*1, 140*b*2, 140*b*3, and 140*b*4 may be respectively rotated by rotation angles A21, A22, A23, and A24 which are greater than 0 degrees and less than 60 degrees with respect to the reference point within corresponding pattern regions PR1, PR2, PR3, and PR4. For example, a difference between the rotation angles A21, A22, A23, and A24 of the first to fourth sub light extraction patterns 140*b*1, 140*b*2, 140*b*3, and 140*b*4 may be a maximum of 15 degrees, and in this case, a diffraction angle of reflected light by each of the first to fourth sub light extraction patterns 140*b*1, 140*b*2, 140*b*3, and 140*b*4 may be maximized. For example, in FIG. 10, the first sub rotation angle A21 of the first sub light extraction pattern 140*b*1 may be 0 degrees, the second sub rotation angle A22 of the second sub light extraction pattern 140*b*2 may be 7.5 degrees, the third sub rotation angle A23 of the third sub light extraction pattern 140*b*3 may be 15 degrees, and the fourth sub rotation angle A24 of the fourth sub light extraction pattern 140*b*4** may be 22.5 degrees, but embodiments of the present disclosure are not limited thereto.

In the second subpixel SP2, in each of the first to fourth subpixels SP1, SP2, SP3, and SP4, a boundary portion between the first to fourth pattern regions PR1, PR2, PR3, and PR4 may include a convex portion 143 having an irregular shape, and thus, reflection light reflected by the convex portion 143 of the boundary portion may have an irregular diffraction characteristic.

The second subpixel SP2 according to another embodiment of the present disclosure may include the first to fourth sub light extraction patterns **140*b*1, 140*b*2, 140*b*3, and 140*b*4, which have different angles A21, A22, A23, and A24, and thus, the regularity of reflected light (particularly, white reflected light) may more decrease or the randomness thereof may more increase. Accordingly, a probability of occurrence of constructive interference between reflection lights reflected by light extraction patterns 140** disposed at pixels may more decrease, or a probability of occurrence of destructive interference may more increase.

Figure 11:
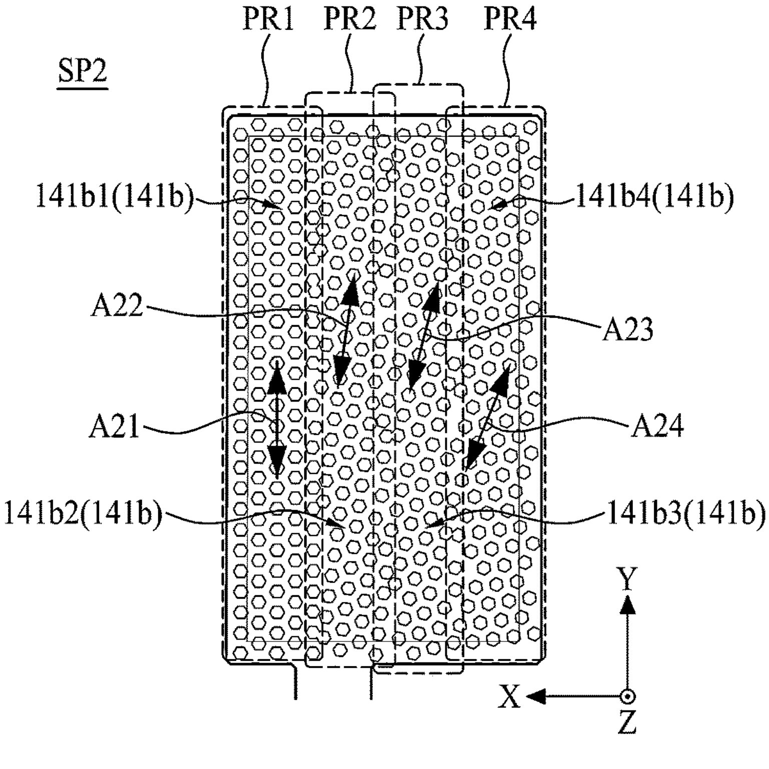
FIG. 11 is a diagram illustrating a light extraction pattern of a second subpixel according to another embodiment of the present disclosure.

FIG. 11 is a diagram illustrating a light extraction pattern of a second subpixel according to another embodiment of the present disclosure. FIG. 11 illustrates an embodiment implemented by modifying the pattern region of the second subpixel illustrated in FIGS. 2, 5, and 10.

Referring to FIGS. 5 and 11, a second subpixel SP2 according to another embodiment (or a fifth embodiment) of the present disclosure may include first to fourth pattern regions PR1, PR2, PR3, and PR4.

The first to fourth pattern regions PR1, PR2, PR3, and PR4 may be separated or spatially separated from each other within the second subpixel SP2. The first to fourth pattern regions PR1, PR2, PR3, and PR4 may be disposed in parallel along a first direction X within the second subpixel SP2. For example, each of the first to fourth pattern regions PR1, PR2, PR3, and PR4 may have a rectangular shape which extends along a second direction Y. For example, the second subpixel SP2 may have a left-right four-division structure (or a horizontal four-division tetragonal structure) by the first to fourth pattern regions PR1, PR2, PR3, and PR4. The first to fourth pattern regions PR1, PR2, PR3, and PR4 may have a same size (or area), but embodiments of the present disclosure are not limited thereto.

The second light extraction pattern 140*b* disposed at the second subpixel SP2 may include a first sub light extraction pattern 140*b*1 disposed at the first pattern region PR1, a second sub light extraction pattern 140*b*2 disposed at the second pattern region PR2, a third sub light extraction pattern 140*b*3 disposed at the third pattern region PR3, and a fourth sub light extraction pattern 140*b*4 disposed at the fourth pattern region PR4. Except for that the first to fourth sub light extraction patterns 140*b*1, 140*b*2, 140*b*3, and 140*b*4 are respectively disposed in the first to fourth pattern regions PR1, PR2, PR3, and PR4 of the second subpixel SP2 having a horizontal four-division structure, the first to fourth sub light extraction patterns 140*b*1, 140*b*2, 140*b*3, and 140*b*4 may be a same as the first to fourth sub light extraction patterns 140*b*1, 140*b*2, 140*b*3, and 140*b*4 described above with reference to FIG. 10, and thus, repeated descriptions thereof are omitted.

The second subpixel SP2 according to another embodiment of the present disclosure may include the first to fourth sub light extraction patterns 140*b*1, 140*b*2, 140*b*3, and 140*b*4, which have different angles A21, A22, A23, and A24, and thus, the regularity of reflected light (particularly, white reflected light) may more decrease or the randomness thereof may more increase. Accordingly, a probability of occurrence of constructive interference between reflection lights reflected by light extraction patterns 140 disposed at pixels may more decrease, or a probability of occurrence of destructive interference may more increase.

Figure 12:
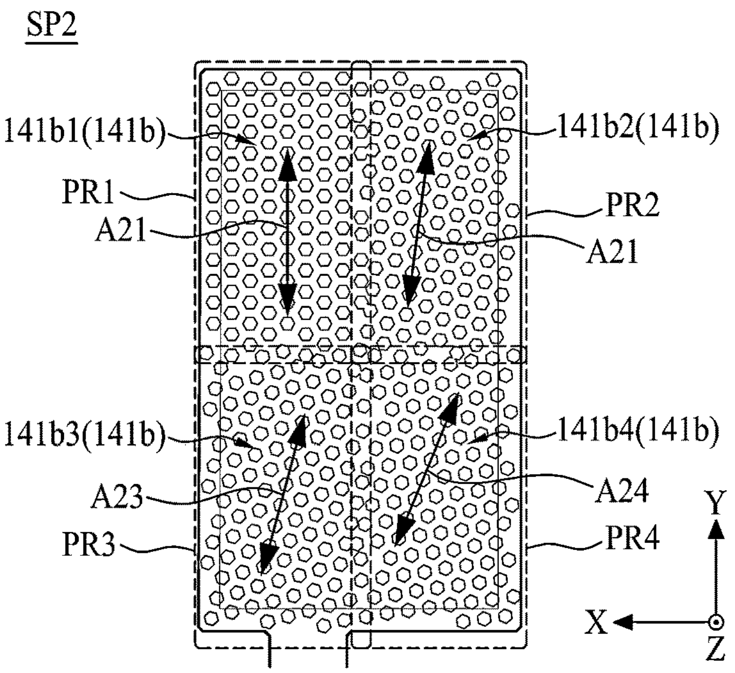
FIG. 12 is a diagram illustrating a light extraction pattern of a second subpixel according to another embodiment of the present disclosure.

FIG. 12 is a diagram illustrating a light extraction pattern of a second subpixel according to another embodiment of the present disclosure. FIG. 12 illustrates an embodiment implemented by modifying the pattern region of the second subpixel illustrated in FIGS. 2, 5, and 10.

Referring to FIGS. 5 and 12, a second subpixel SP2 according to another embodiment (or a sixth embodiment) of the present disclosure may include first to fourth pattern regions PR1 to PR4.

The first to fourth pattern regions PR1, PR2, PR3, and PR4 may be separated or spatially separated from each other within the second subpixel SP2. The first to fourth pattern regions PR1, PR2, PR3, and PR4 may be disposed in parallel along a first direction X and a second direction Y within the second subpixel SP2. For example, each the first to fourth pattern regions PR1, PR2, PR3, and PR4 may be disposed in a lattice pattern shape or a checkered pattern shape in the second subpixel SP2. For example, each of the first to fourth pattern regions PR1, PR2, PR3, and PR4 may have a rectangular shape which extends along the second direction Y. For example, the second subpixel SP2 may have a vertical-horizontal division structure (or a four-division lattice pattern structure or a four-division tetragonal structure) by the first to fourth pattern regions PR1, PR2, PR3, and PR4. The first to fourth pattern regions PR1, PR2, PR3, and PR4 may have a same size (or area), but embodiments of the present disclosure are not limited thereto.

The second light extraction pattern 140*b* disposed at the second subpixel SP2 may include a first sub light extraction pattern 140*b*1 disposed at the first pattern region PR1, a second sub light extraction pattern 140*b*2 disposed at the second pattern region PR2, a third sub light extraction pattern 140*b*3 disposed at the third pattern region PR3, and a fourth sub light extraction pattern 140*b*4 disposed at the fourth pattern region PR4. Except for that first to fourth sub light extraction patterns 140*b*1, 140*b*2, 140*b*3, and 140*b*4 are respectively disposed in the first to fourth pattern regions PR1, PR2, PR3, and PR4 of the second subpixel SP2 having the vertical-horizontal division structure, the first to fourth sub light extraction patterns 140*b*1, 140*b*2, 140*b*3, and 140*b*4 may be a same as the first to fourth sub light extraction patterns 140*b*1, 140*b*2, 140*b*3, and 140*b*4 described above with reference to FIG. 10, and thus, repeated descriptions thereof are omitted.

The second subpixel SP2 according to another embodiment of the present disclosure may include the first to fourth sub light extraction patterns 140*b*1, 140*b*2, 140*b*3, and 140*b*4, which have different angles A21, A22, A23, and A24, and thus, the regularity of reflected light (particularly, white reflected light) may more decrease or the randomness thereof may more increase. Accordingly, a probability of occurrence of constructive interference between reflection lights reflected by light extraction patterns 140 disposed at pixels may more decrease, or a probability of occurrence of destructive interference may more increase.

Figure 13:
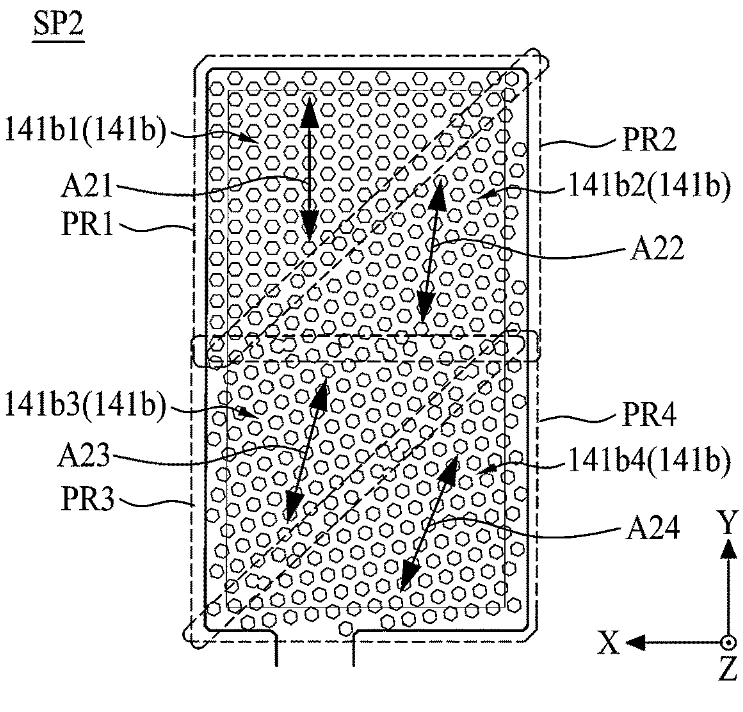
FIG. 13 is a diagram illustrating a light extraction pattern of a second subpixel according to another embodiment of the present disclosure.

FIG. 13 is a diagram illustrating a light extraction pattern of a second subpixel according to another embodiment of the present disclosure. FIG. 13 illustrates an embodiment implemented by modifying the pattern region of the second subpixel illustrated in FIGS. 2, 5, and 10.

Referring to FIGS. 5 and 13, a second subpixel SP2 according to another embodiment (or a seventh embodiment) of the present disclosure may include first to fourth pattern regions PR1, PR2, PR3, and PR4.

The first to fourth pattern regions PR1, PR2, PR3, and PR4 may be separated or spatially separated from each other within the second subpixel SP2. The first to fourth pattern regions PR1, PR2, PR3, and PR4 may be disposed in parallel along a second direction Y within the second subpixel SP2. For example, the first to fourth pattern regions PR1, PR2, PR3, and PR4 may be disposed in parallel along the second direction Y and a diagonal direction within the second subpixel SP2. For example, each of the first to fourth pattern regions PR1, PR2, PR3, and PR4 may have a triangular shape. For example, the second subpixel SP2 may have a diagonal division structure (or a vertical four-division triangular structure) by the first to fourth pattern regions PR1, PR2, PR3, and PR4. The first to fourth pattern regions PR1, PR2, PR3, and PR4 may have a same size (or area), but embodiments of the present disclosure are not limited thereto.

The second light extraction pattern 140*b* disposed at the second subpixel SP2 may include a first sub light extraction pattern 140*b*1 disposed at the first pattern region PR1, a second sub light extraction pattern 140*b*2 disposed at the second pattern region PR2, a third sub light extraction pattern **140*b*3 disposed at the third pattern region PR3, and a fourth sub light extraction pattern 140*b*4 disposed at the fourth pattern region PR4. Except for that first to fourth sub light extraction patterns 140*b*1, 140*b*2, 140*b*3, and 140*b*4 are respectively disposed in the first to fourth pattern regions PR1, PR2, PR3, and PR4 of the second subpixel SP2 having the vertical-horizontal division structure, the first to fourth sub light extraction patterns 140*b*1, 140*b*2, 140*b*3, and 140*b*4 may be a same as the first to fourth sub light extraction patterns 140*b*1, 140*b*2, 140*b*3, and 140*b*4 described above with reference to FIG. 10**, and thus, repeated descriptions thereof are omitted.

The second subpixel SP2 according to another embodiment of the present disclosure may include the first to fourth sub light extraction patterns **140*b*1, 140*b*2, 140*b*3, and 140*b*4, which have different angles A21, A22, A23, and A24, and thus, the regularity of reflected light (particularly, white reflected light) may more decrease or the randomness thereof may more increase. Accordingly, a probability of occurrence of constructive interference between reflection lights reflected by light extraction patterns 140** disposed at pixels may more decrease, or a probability of occurrence of destructive interference may more increase.

Figure 14:
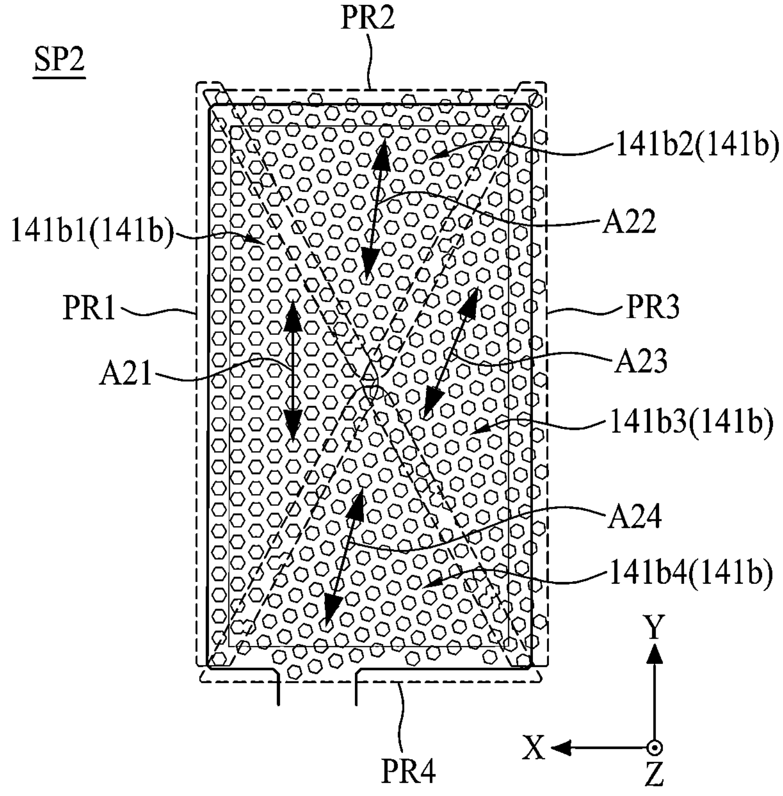
FIG. 14 is a diagram illustrating a light extraction pattern of a second subpixel according to another embodiment of the present disclosure.

FIG. 14 is a diagram illustrating a light extraction pattern of a second subpixel according to another embodiment of the present disclosure. FIG. 14 illustrates an embodiment implemented by modifying the pattern region of the second subpixel illustrated in FIGS. 2, 5, and 10.

Referring to FIGS. 5 and 14, a second subpixel SP2 according to another embodiment (or an eighth embodiment) of the present disclosure may include first to fourth pattern regions PR1, PR2, PR3, and PR4.

The first to fourth pattern regions PR1, PR2, PR3, and PR4 may be separated or spatially separated from each other within the second subpixel SP2. The first to fourth pattern regions PR1, PR2, PR3, and PR4 may be disposed in a lattice checkered structure along each of a first direction X and a second direction Y within the second subpixel SP2. For example, each of the first to fourth pattern regions PR1, PR2, PR3, and PR4 may have a triangular shape. For example, the second subpixel SP2 may have a vertical-horizontal (a top/bottom/left/right) diagonal division structure (or a four-division triangular structure) by the first to fourth pattern regions PR1, PR2, PR3, and PR4.

According to an embodiment of the present disclosure, the first and third pattern regions PR1 and PR3 may be a left region and a right region of the second subpixel SP2, and the second and fourth pattern regions PR2 and PR4 may be an upper region and a lower region of the second subpixel SP2, but embodiments of the present disclosure are not limited thereto. Some of the first to fourth pattern regions PR1, PR2, PR3, and PR4 may have a same size (or area), and the other may have different sizes (or areas). For example, the first and third pattern regions PR1 and PR3 may have a same size (or area). The second and fourth pattern regions PR2 and PR4 may have a same size (or area). The first and third pattern regions PR1 and PR3 may have a size which is greater than the second and fourth pattern regions PR2 and PR4.

The second light extraction pattern **140*b* disposed at the second subpixel SP2 may include a first sub light extraction pattern 140*b*1 disposed at the first pattern region PR1, a second sub light extraction pattern 140*b*2 disposed at the second pattern region PR2, a third sub light extraction pattern 140*b*3 disposed at the third pattern region PR3, and a fourth sub light extraction pattern 140*b*4 disposed at the fourth pattern region PR4. Except for that first to fourth sub light extraction patterns 140*b*1, 140*b*2, 140*b*3, and 140*b*4 are respectively disposed at the first to fourth pattern regions PR1 to PR4 of the second subpixel SP2 having the vertical-horizontal diagonal division structure, the first to fourth sub light extraction patterns 140*b*1, 140*b*2, 140*b*3, and 140*b*4 may be a same as the first to fourth sub light extraction patterns 140*b*1, 140*b*2, 140*b*3, and 140*b*4 described above with reference to FIG. 10**, and thus, repeated descriptions thereof are omitted.

The second subpixel SP2 according to another embodiment of the present disclosure may include the first to fourth sub light extraction patterns **140*b*1, 140*b*2, 140*b*3, and 140*b*4, which have different angles A21, A22, A23, and A24, and thus, the regularity of reflected light (particularly, white reflected light) may more decrease or the randomness thereof may more increase. Accordingly, a probability of occurrence of constructive interference between reflection lights reflected by light extraction patterns 140** disposed at pixels may more decrease, or a probability of occurrence of destructive interference may more increase.

According to another embodiment of the present disclosure, in FIGS. 10 to 14, the second subpixel SP2 is illustrated as including the first to fourth pattern regions PR1, PR2, PR3, and PR4 and the first to fourth sub light extraction patterns **140*b*1, 140*b*2, 140*b*3, and 140*b*4, but embodiments of the present disclosure are not limited thereto. For example, the second subpixel SP2 may include the first to third pattern regions PR1, PR2, and PR3 having a same size or different sizes and the first to third sub light extraction patterns 140*b*1, 140*b*2, and 140*b*3 which are respectively disposed in the first to third pattern regions PR1 PR2, and PR3 and have different rotation angles A21, A22, and A23**.

According to another embodiment of the present disclosure, in FIGS. 2, 5, and 10 to 14, the second subpixel SP2 is illustrated as including a two-division structure or a four-division structure, but embodiments of the present disclosure are not limited thereto. The second subpixel SP2 may include two or more pattern regions based on a two or more-division structure and two or more sub light extraction patterns which are respectively disposed in two or more pattern regions and have rotated by different angles.

Figure 15:
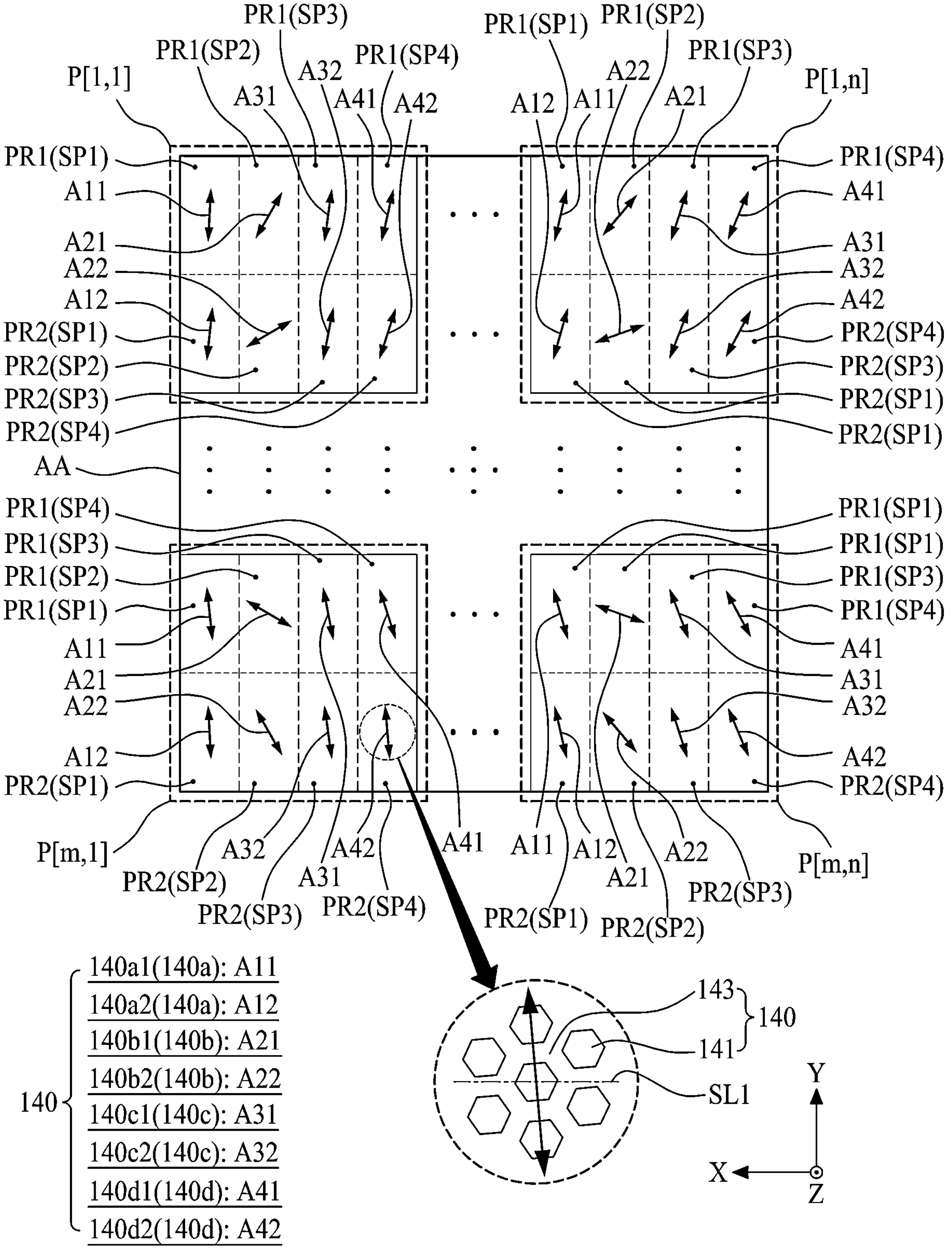
FIG. 15 is a diagram illustrating a rotation structure of a light extraction pattern according to another embodiment of the present disclosure.

FIG. 15 is a diagram illustrating a rotation structure of a light extraction pattern according to another embodiment of the present disclosure. A bidirectional arrow illustrated in FIG. 15 represents a rotation angle (or a rotation direction) of a light extraction pattern.

Referring to FIG. 15, in an organic light emitting display apparatus according to an embodiment of the present disclosure, a display area AA may include a plurality of pixels P[1,1] to P[m,n]) each including first to fourth subpixels SP1, SP2, SP3, and SP4 arranged along each of a first direction X and a second direction Y and light extraction patterns 140 respectively provided in the first to fourth subpixels SP1, SP2, SP3, and SP4 of each of the plurality of pixels P[1,1] to P[m,n].

In each of the plurality of pixels P[1,1] to P[m,n], each of the first to fourth subpixels SP1, SP2, SP3, and SP4 may include a plurality of pattern regions PR1 and PR2. For example, each of the first to fourth subpixels SP1 to SP4 may include a first pattern region PR1 and a second pattern region PR2.

The first pattern region PR1 and the second pattern region PR2 may be disposed along a second direction Y. For example, the first pattern region PR1 may be an upper side region (or an upper region) of the second subpixel SP2, and the second pattern region PR2 may be a lower side region (or a lower region) of the second subpixel SP2. For example, the second subpixel SP2 may have an upward-downward two-division structure (or a vertical two-division tetragonal structure) by the first pattern region PR1 and the second pattern region PR2. For example, the first pattern region PR1 and the second pattern region PR2 may have a same size (or area), but embodiments of the present disclosure are not limited thereto.

The light extraction patterns 140 may be rotated by rotation angles A11, A12, A21, A22, A31, A32, A41, and A42 which are previously set at each of the first pattern region PR1 and the second pattern region PR2 of each of the first to fourth subpixels SP1, SP2, SP3, and SP4 configured at each of the plurality of pixels P[1,1] to P[m,n]. The light extraction patterns 140 respectively disposed at the first pattern region PR1 and the second pattern region PR2 may be rotated by different rotation angles A11, A12, A21, A22, A31, A32, A41, and A42 by pixels P[1,1] to P[m,n] units and subpixels SP1, SP2, SP3, and SP4 units. The light extraction patterns 140 respectively disposed at the first pattern region PR1 and the second pattern region PR2 of each of the first to fourth subpixels SP1, SP2, SP3, and SP4 which is configured at one of the plurality of pixels P[1,1] to P[m,n] may be rotated by different angles. For example, some of the light extraction patterns 140 may be rotated by a same rotation angles A11, A12, A21, A22, A31, A32, A41, and A42, based on the number of pixels P disposed at the display area AA. For example, the light extraction patterns 140 which have rotated by a same rotation angles A11, A12, A21, A22, A31, A32, A41, and A42 may be separated from one another by an interval corresponding to the plurality of pixels P[1,1] to P[m,n], in the display area AA.

According to an embodiment of the present disclosure, when the light extraction patterns 140 has a planar structure having a hexagonal shape (or a honeycomb shape), the light extraction patterns 140 respectively disposed at the first pattern region PR1 and the second pattern region PR2 by pixels P[1,1] to P[m,n] and first to fourth subpixels SP1, SP2, SP3, and SP4 units may be rotated by an angle of more than 0 degrees and less than 60 degrees with respect to a reference point. In each of the first to fourth subpixels SP1, SP2, SP3, and SP4, rotation angles of the light extraction patterns 140 respectively disposed at the first pattern region PR1 and the second pattern region PR2 may have a maximum of 30-degree difference therebetween, but embodiments of the present disclosure are not limited thereto. For example, rotation angles of light extraction patterns 140 disposed at a same adjacent pixels P[1,1] to P[m,n] may have a maximum of 30-degree difference therebetween, but embodiments of the present disclosure are not limited thereto.

The light extraction pattern 140 may include first to fourth light extraction patterns 140*a*, 140*b*, 140*c*, and 140*d* respectively disposed in the first to fourth subpixels SP1, SP2, SP3, and SP4.

The second light extraction pattern 140*b* may include a plurality of sub light extraction patterns 140*b*1 and 140*b*2. For example, the second light extraction pattern 140*b* may include two or more sub light extraction patterns 140*b*1 and 140*b*2. For example, the second light extraction pattern 140*b* may include a first sub light extraction pattern (or a 2-1 sub light extraction pattern) 140*b*1 and a second sub light extraction pattern (or a 2-2 sub light extraction pattern) 140*b*2.

The first sub light extraction pattern 140*b*1 and the second sub light extraction pattern 140*b*2 of the second light extraction pattern 140*b* may be substantially a same as the first sub light extraction pattern 140*b*1 and the second sub light extraction pattern 140*b*2 of the second subpixel SP described above with reference to FIGS. 2 to 7B, and thus, like reference numerals refer to like elements and repeated descriptions thereof are omitted.

The first light extraction pattern 140*a* may include a plurality of sub light extraction patterns 140*a*1 and 140*a*2. For example, the first light extraction pattern 140*a* may include two or more sub light extraction patterns 140*a*1 and 140*a*2. For example, the first light extraction pattern 140*a* may include a first sub light extraction pattern (or a fifth sub light extraction pattern or a 1-1 sub light extraction pattern) 140*a*1 and a second sub light extraction pattern (or a sixth sub light extraction pattern or a 1-2 sub light extraction pattern) 140*a*2.

Each of the first sub light extraction pattern 140*a*1 and the second sub light extraction pattern 140*a*2 of the first light extraction pattern 140*a* may include the plurality of concave portions 141 and the convex portion 143 between the plurality of concave portions 141, described above with reference to FIG. 2, and thus, repeated descriptions thereof are omitted. The first sub light extraction pattern 140*a*1 of the first light extraction pattern 140*a* may be rotated or reversely rotated by a first sub rotation angle (or a fifth rotation angle or a 1-1 rotation angle) A11 with respect to a reference point within the first pattern region PR1. The second sub light extraction pattern 140*a*2 of the first light extraction pattern 140*a* may be rotated or reversely rotated by a second sub rotation angle (or a sixth rotation angle or a 1-2 rotation angle) A12 with respect to a reference point within the second pattern region PR1. For example, when the first light extraction pattern 140*a* has a planar structure having a hexagonal shape (or a honeycomb shape), a difference between the 1-1 rotation angle A11 and the 1-2 rotation angle A12 may be a maximum of 30 degrees, but embodiments according to present disclosure are not limited thereto.

The third light extraction pattern 140*c* may include a plurality of sub light extraction patterns 140*c*1 and 140*c*2. For example, the third light extraction pattern 140*c* may include two or more sub light extraction patterns 140*c*1 and 140*c*2. For example, the third light extraction pattern 140*c* may include a first sub light extraction pattern (or a seventh sub light extraction pattern or a 3-1 sub light extraction pattern) 140*c*1 and a second sub light extraction pattern (or an eighth sub light extraction pattern or a 3-2 sub light extraction pattern) 140*c*2.

Each of the first sub light extraction pattern 140*c*1 and the second sub light extraction pattern 140*c*2 of the third light extraction pattern 140*c* may include the plurality of concave portions 141 and the convex portion 143 between the plurality of concave portions 141, described above with reference to FIG. 2, and thus, repeated descriptions thereof are omitted. The first sub light extraction pattern 140*c*1 of the third light extraction pattern 140*c* may be rotated or reversely rotated by a first sub rotation angle (or a seventh rotation angle or a 3-1 rotation angle) A31 with respect to a reference point within the first pattern region PR1. The second sub light extraction pattern 140*c*2 of the third light extraction pattern 140*c* may be rotated or reversely rotated by a second sub rotation angle (or an eighth rotation angle or a 2-2 rotation angle) A32 with respect to a reference point within the second pattern region PR2. For example, when the third light extraction pattern 140*c* has a planar structure having a hexagonal shape (or a honeycomb shape), a difference between the 3-1 rotation angle A31 and the 3-2 rotation angle A32 may be a maximum of 30 degrees, but embodiments according to present disclosure are not limited thereto.

The fourth light extraction pattern 140*d* may include a plurality of sub light extraction patterns 140*d*1 and 140*d*2. For example, the fourth light extraction pattern 140*d* may include two or more sub light extraction patterns 140*d*1 and 140*d*2. For example, the fourth light extraction pattern 140*d* may include a first sub light extraction pattern (or a ninth sub light extraction pattern or a 4-1 sub light extraction pattern) 140*d*1 and a second sub light extraction pattern (or a tenth sub light extraction pattern or a 4-2 sub light extraction pattern) 140*d*2.

Each of the first sub light extraction pattern 140*d*1 and the second sub light extraction pattern 140*d*2 of the fourth light extraction pattern 140*d* may include the plurality of concave portions 141 and the convex portion 143 between the plurality of concave portions 141, described above with reference to FIG. 2, and thus, repeated descriptions thereof are omitted. The first sub light extraction pattern 140*d*1 of the fourth light extraction pattern 140*d* may be rotated or reversely rotated by a first sub rotation angle (or a ninth rotation angle or a 4-1 rotation angle) A41 with respect to the reference point within a first pattern region PR1. The second sub light extraction pattern 140*d*2 of the fourth light extraction pattern 140*d* may be rotated or reversely rotated by a second sub rotation angle (or a tenth rotation angle or a 4-2 rotation angle) A42 with respect to a reference point within the second pattern region PR2. For example, when the fourth light extraction pattern 140*d* has a planar structure having a hexagonal shape (or a honeycomb shape), a difference between the 4-1 rotation angle A41 and the 4-2 rotation angle A42 may be a maximum of 30 degrees, but embodiments according to present disclosure are not limited thereto.

In each of the first to fourth subpixels SP1, SP2, SP3, and SP4, a boundary portion between the first and second pattern regions PR1 and PR2 may include a convex portion 143 having an irregular shape, and thus, reflection light reflected by the convex portion 143 of the boundary portion may have an irregular diffraction characteristic.

As described above, according to another embodiment of the present disclosure, the first to fourth subpixels SP1, SP2, SP3, and SP4 of each of the plurality of pixels P[1,1] to P[m,n] may respectively include the first sub light extraction patterns 140*a*1, 140*b*1, 140*c*1, and 140*d*1 and the second sub light extraction patterns 140*a*2, 140*b*2, 140*c*2, 140*d*2 which have rotated by different rotation angles, and thus, the regularity of reflection light reflected by the light extraction pattern 140 may more decrease or the randomness of the reflection light may more increase, thereby more preventing or more minimizing the occurrence of rainbow Mura where reflected light is spread in a radial shape and/or circular ring Mura where reflected light is spread in a radial shape. Accordingly, a black visibility characteristic or a black color (or black rising) phenomenon caused by the reflection of external light may be more reduced in a non-driving or off state.

Figure 16A:
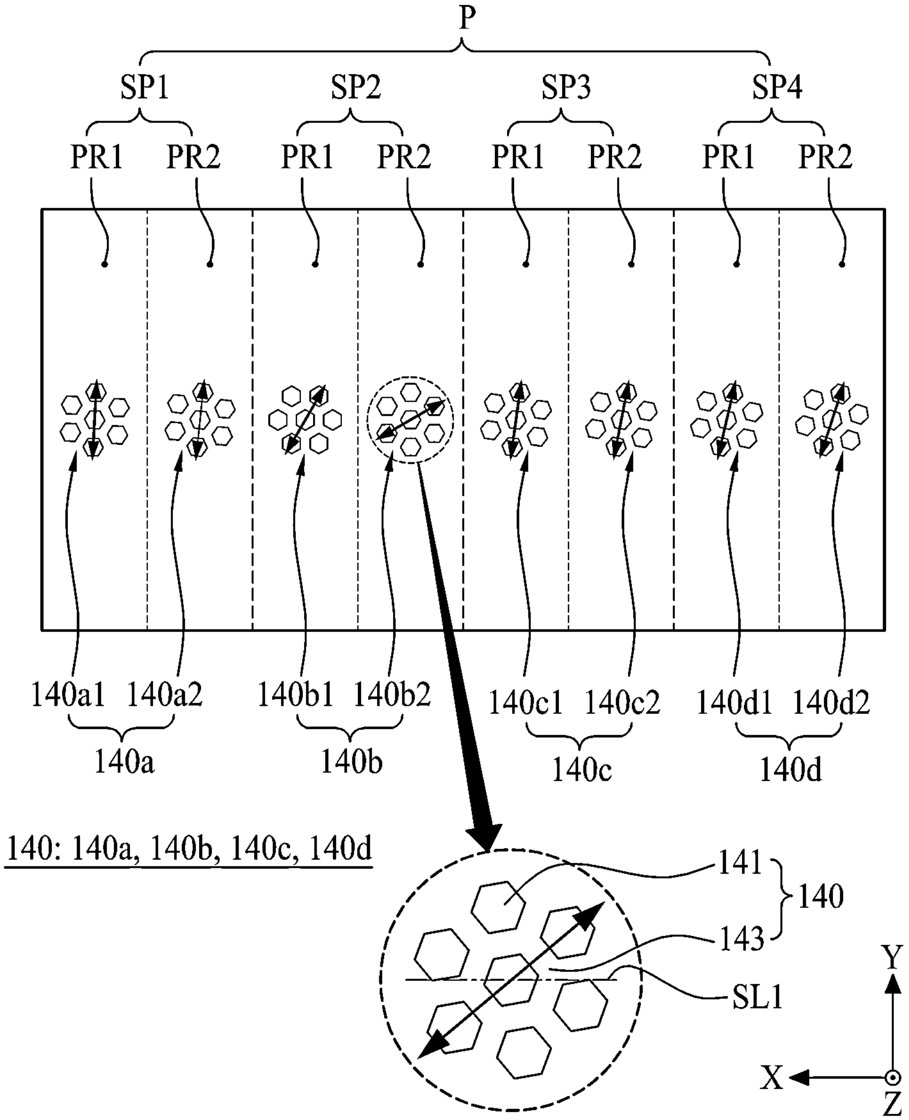
FIGS. 16A and 16B are a diagram illustrating a rotation structure of a light extraction pattern according to another embodiment of the present disclosure.
Figure 16B:
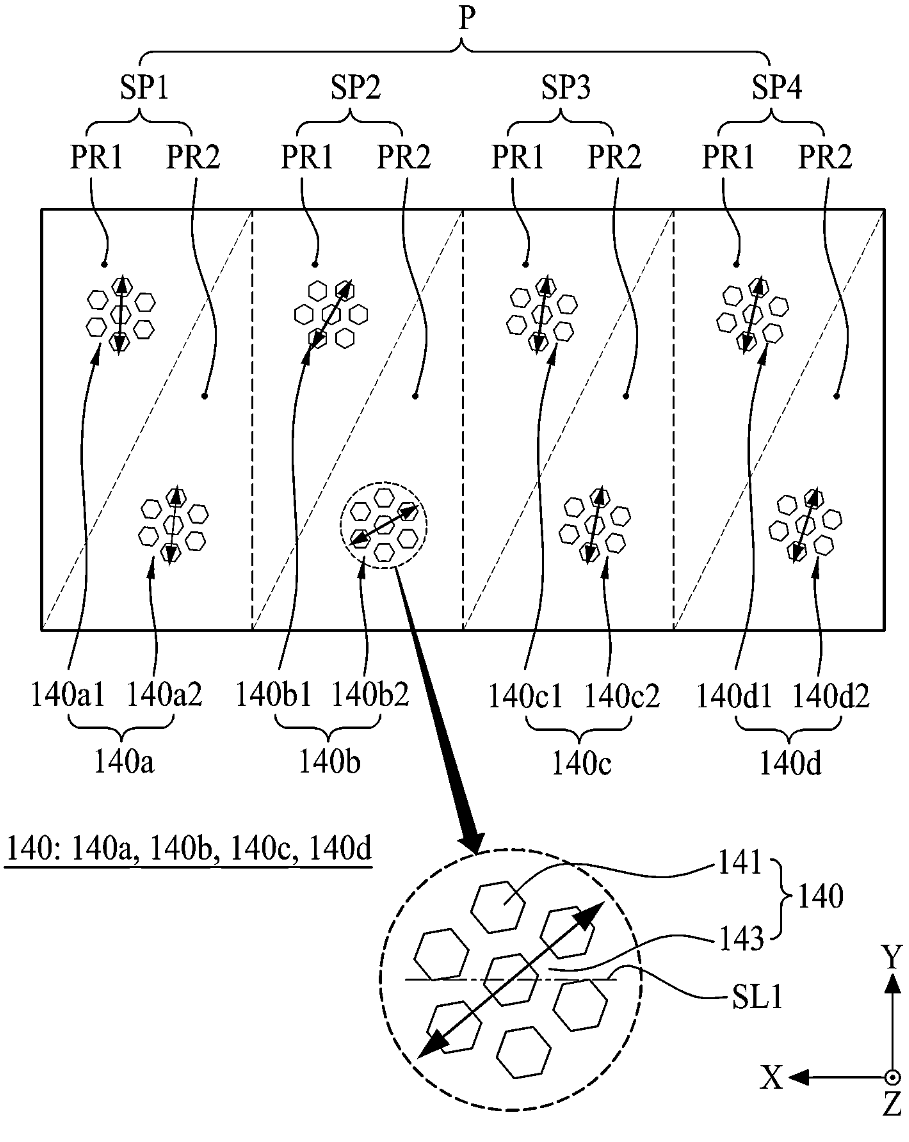

FIGS. 16A and 16B are a diagram illustrating a rotation structure of a light extraction pattern according to another embodiment of the present disclosure. Except for that a pattern region of each of first to fourth subpixels is modified, FIGS. 16A and 16B may be a same as FIG. 15 described above. Hereinafter, therefore, like reference numerals refer to like elements, and only different elements will be described. A bidirectional arrow illustrated in FIGS. 16A and 16B represents a rotation angle (or a rotation direction) of a light extraction pattern.

Referring to FIG. 16A, a first pattern region PR1 and a second pattern region PR2 configured at each of first to fourth subpixels SP1 to SP4 of each of a plurality of pixels P may be disposed in parallel along a first direction X within corresponding subpixels SP1, SP2, SP3, and SP4. For example, each of the first pattern region PR1 and the second pattern region PR2 may have a rectangular shape which extends along a second direction Y. For example, the first pattern region PR1 may be a left region of the second subpixel SP2, and the second pattern region PR2 may be a right region of the second subpixel SP2. For example, each of the first to fourth subpixels SP1, SP2, SP3, and SP4 may have a left-right two-division structure (or a horizontal two-division tetragonal structure) by the first pattern region PR1 and the second pattern region PR2. The first pattern region PR1 and the second pattern region PR2 may have a same size (or area), but embodiments of the present disclosure are not limited thereto. For example, the first and second pattern regions PR1 and PR2 of the second subpixel SP2 may be a same as the first and second pattern regions PR1 and PR2 of the second subpixel SP2 described above with reference to FIG. 8. The first and second pattern regions PR1 and PR2 of each of the first, third, and fourth subpixels SP1, SP3, and SP4 may be configured to be equal to the first and second pattern regions PR1 and PR2 of the second subpixel SP2 described above with reference to FIG. 8.

Referring to FIG. 16B, a first pattern region PR1 and a second pattern region PR2 configured at each of first to fourth subpixels SP1, SP2, SP3, and SP4 of each of a plurality of pixels P may be disposed in parallel along a diagonal direction between a first direction X and a second direction Y within corresponding subpixels SP1, SP2, SP3, and SP4. For example, each of the first and second pattern regions PR1 and PR2 may have a triangular shape. For example, each of first to fourth subpixels SP1, SP2, SP3, and SP4 may have a diagonal division structure (or a two-division triangular structure) by the first pattern region PR1 and the second pattern region PR2. For example, the first pattern region PR1 and the second pattern region PR2 may have a same size (or area), but embodiments of the present disclosure are not limited thereto. For example, the first and second pattern regions PR1 and PR2 of the second subpixel SP2 may be a same as the first and second pattern regions PR1 and PR2 of the second subpixel SP2 described above with reference to FIG. 9. The first and second pattern regions PR1 and PR2 of each of the first, third, and fourth subpixels SP1, SP3, and SP4 may be configured to be equal to the first and second pattern regions PR1 and PR2 of the second subpixel SP2 described above with reference to FIG. 9.

As described above, according to another embodiment of the present disclosure, the first to fourth subpixels SP1, SP2, SP3, and SP4 of each of the plurality of pixels P[1,1] to P[m,n] may respectively include the first sub light extraction patterns 140*a*1, 140*b*1, 140*c*1, and 140*d*1 and the second sub light extraction patterns 140*a*2, 140*b*2, 140*c*2, 140*d*2 which have rotated by different rotation angles, and thus, the regularity of reflection light reflected by the light extraction pattern 140 may more decrease or the randomness of the reflection light may more increase, thereby more preventing or more minimizing the occurrence of rainbow Mura where reflected light is spread in a radial shape and/or circular ring Mura where reflected light is spread in a radial shape. Accordingly, a black visibility characteristic or a black color (or black rising) phenomenon caused by the reflection of external light may be more reduced in a non-driving or off state.

Figure 17:
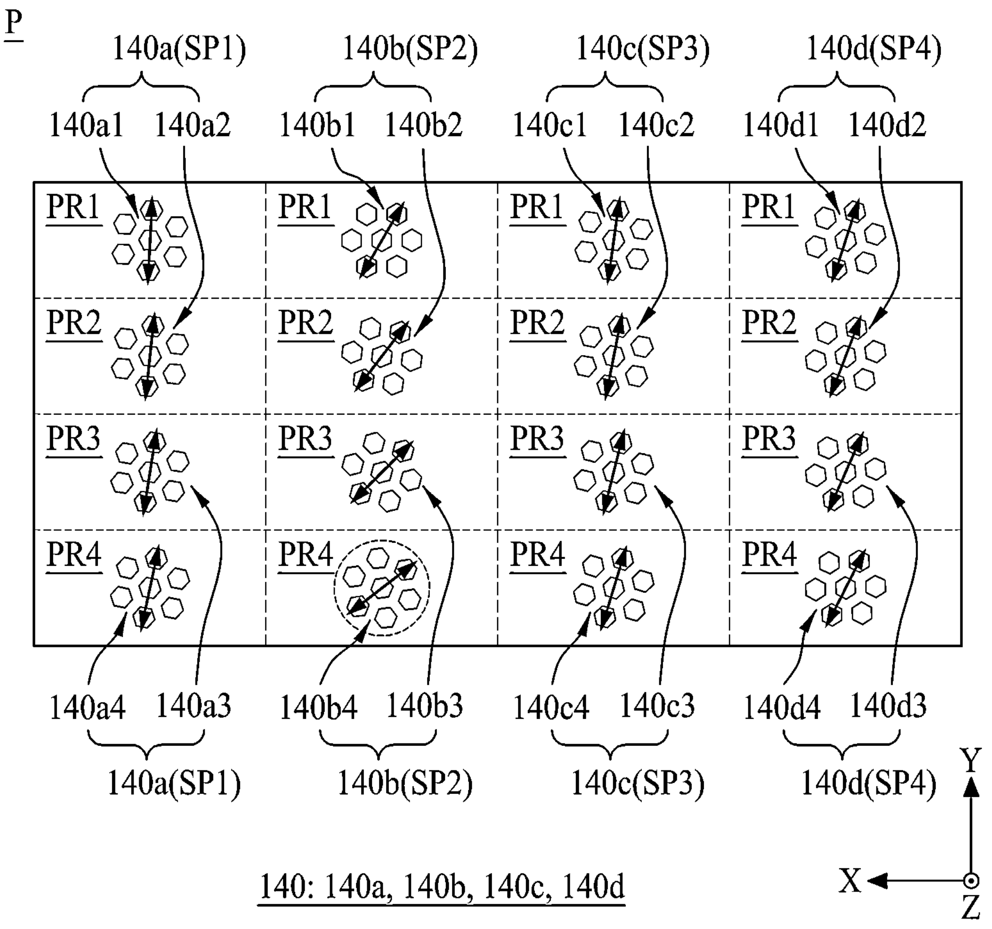
FIG. 17 is a diagram illustrating a rotation structure of a light extraction pattern according to another embodiment of the present disclosure.

FIG. 17 is a diagram illustrating a rotation structure of a light extraction pattern according to another embodiment of the present disclosure. Except for that a pattern region of each of first to fourth subpixels is modified, FIG. 17 may be a same as FIG. 15 described above. Hereinafter, therefore, like reference numerals refer to like elements, and only different elements will be described. A bidirectional arrow illustrated in FIG. 17 represents a rotation angle (or a rotation direction) of a light extraction pattern.

Referring to FIG. 17, in an organic light emitting display apparatus according to an embodiment of the present disclosure, each of first to fourth subpixels SP1, SP2, SP3, and SP4 of a pixel P may include first to fourth pattern regions PR1, PR2, PR3, and PR4.

The first to fourth pattern regions PR1, PR2, PR3, and PR4 may be separated or spatially separated from each other within corresponding subpixels SP1, SP2, SP3, and SP4. The first to fourth pattern regions PR1, PR2, PR3, and PR4 may be disposed in parallel along a second direction Y within corresponding subpixels SP1, SP2, SP3, and SP4. For example, each of the first to fourth pattern regions PR1, PR2, PR3, and PR4 may have a rectangular shape which extends along a first direction X. For example, each of the subpixels SP1, SP2, SP3, and SP4 may have an upward-downward four-division structure (or a vertical four-division tetragonal structure) by the first to fourth pattern regions PR1, PR2, PR3, and PR4. The first to fourth pattern regions PR1, PR2, PR3, and PR4 may have a same size (or area), but embodiments of the present disclosure are not limited thereto.

The light extraction patterns 140 may be respectively disposed in the first to fourth pattern regions PR1, PR2, PR3, and PR4 of each of the first to fourth subpixels SP1, SP2, SP3, and SP4 and may be rotated by a predetermined rotation angle. The light extraction patterns 140 respectively disposed in the first to fourth pattern regions PR1, PR2, PR3, and PR4 may be rotated by different rotation angles. The light extraction patterns 140 disposed at each of the first to fourth pattern regions PR1, PR2, PR3, and PR4 may be rotated by different angles.

According to an embodiment of the present disclosure, when the light extraction patterns 140 has a planar structure having a hexagonal shape (or a honeycomb shape), the light extraction patterns 140 respectively disposed at the first to fourth pattern regions PR1, PR2, PR3, and PR4 may be rotated by an angle of more than 0 degrees and less than 60 degrees with respect to a reference point. In each of the first to fourth subpixels SP1, SP2, SP3, and SP4, rotation angles of the light extraction patterns 140 respectively disposed at the first to fourth pattern regions PR1, PR2, PR3, and PR4 may have a maximum of 15-degree difference therebetween, but embodiments of the present disclosure are not limited thereto.

The light extraction pattern 140 may include first to fourth light extraction patterns 140*a*, 140*b*, 140*c*, and 140*d* respectively disposed at the first to fourth subpixels SP1, SP2, SP3, and SP4.

The second light extraction pattern 140*b* may include a plurality of sub light extraction patterns 140*b*1, 140*b*2, 140*b*3, and 140*b*4. For example, the second light extraction pattern 140*b* may include four sub light extraction patterns 140*b*1, 140*b*2, 140*b*3, and 140*b*4. The four sub light extraction patterns 140*b*1, 140*b*2, 140*b*3, and 140*b*4 may be substantially a same as the first to fourth sub light extraction patterns 140*b*1, 140*b*2, 140*b*3, and 140*b*4 of the second subpixel SP described above with reference to FIG. 10, and thus, like reference numerals refer to like elements and repeated descriptions thereof are omitted.

The first light extraction pattern 140*a* may include a plurality of sub light extraction patterns 140*a*1, 140*a*2, 140*a*3, and 140*a*4. For example, the first light extraction pattern 140*a* may include four sub light extraction patterns 140*a*1, 140*a*2, 140*a*3, and 140*a*4. Each of the four sub light extraction patterns 140*a*1, 140*a*2, 140*a*3, and 140*a*4 configured at the first light extraction pattern 140*a* may include the plurality of concave portions 141 and the convex portion 143 between the plurality of concave portions 141, described above with reference to FIG. 2, and thus, repeated descriptions thereof are omitted.

Except for that the four sub light extraction patterns 140*a*1, 140*a*2, 140*a*3, and 140*a*4 configured at the first light extraction pattern 140*a* are respectively disposed in first to fourth pattern regions PR1, PR2, PR3, and PR4 of a first subpixel SP and have different rotation angles, the four sub light extraction patterns 140*a*1, 140*a*2, 140*a*3, and 140*a*4 may be a same as the first to fourth sub light extraction patterns 140*b*1, 140*b*2, 140*b*3, and 140*b*4 of the second subpixel SP2 described above with reference to FIG. 10, and thus, repeated descriptions thereof are omitted. For example, in FIG. 17, in the first light extraction pattern 140*a*, rotation angles of first to fourth sub light extraction patterns 140*a*1, 140*a*2, 140*a*3, and 140*a*4 may respectively be 3 degrees, 6 degrees, 9 degrees, and 12 degrees, but embodiments of the present disclosure are not limited thereto.

The third light extraction pattern 140*c* may include a plurality of sub light extraction patterns 140*c*1, 140*c*2, 140*c*3, and 140*c*4. For example, the third light extraction pattern 140*c* may include four sub light extraction patterns 140*c*1, 140*c*2, 140*c*3, and 140*c*4. Each of the four sub light extraction patterns 140*a*1, 140*a*2, 140*a*3, and 140*a*4 configured at the third light extraction pattern 140*c* may include the plurality of concave portions 141 and the convex portion 143 between the plurality of concave portions 141, described above with reference to FIG. 2, and thus, repeated descriptions thereof are omitted.

Except for that the four sub light extraction patterns 140*c*1, 140*c*2, 140*c*3, and 140*c*4 configured at the third light extraction pattern 140*c* are respectively disposed in first to fourth pattern regions PR1, PR2, PR3, and PR4 of a first subpixel SP and have different rotation angles, the four sub light extraction patterns 140*c*1, 140*c*2, 140*c*3, and 140*c*4 may be a same as the first to fourth sub light extraction patterns 140*b*1, 140*b*2, 140*b*3, and 140*b*4 of the second subpixel SP2 described above with reference to FIG. 10, and thus, repeated descriptions thereof are omitted. For example, in FIG. 17, in the third light extraction pattern 140*c*, rotation angles of first to fourth sub light extraction patterns 140*c*1, 140*c*2, 140*c*3, and 140*c*4 may respectively be 8 degrees, 11 degrees, 14 degrees, and 17 degrees, but embodiments of the present disclosure are not limited thereto.

The fourth light extraction pattern 140*d* may include a plurality of sub light extraction patterns 140*d*1, 140*d*2, 140*d*3, and 140*d*4. For example, the fourth light extraction pattern 140*d* may include four sub light extraction patterns 140*d*1, 140*d*2, 140*d*3, and 140*d*4. Each of the four sub light extraction patterns 140*d*1, 140*d*2, 140*d*3, and 140*d*4 configured at the fourth light extraction pattern 140*d* may include the plurality of concave portions 141 and the convex portion 143 between the plurality of concave portions 141, described above with reference to FIG. 2, and thus, repeated descriptions thereof are omitted.

Except for that the four sub light extraction patterns **140*d*1, 140*d*2, 140*d*3, and 140*d*4 configured at the fourth light extraction pattern 140*d* are respectively disposed in first to fourth pattern regions PR1, PR2, PR3, and PR4 of a first subpixel SP and have different rotation angles, the four sub light extraction patterns 140*d*1, 140*d*2, 140*d*3, and 140*d*4 may be a same as the first to fourth sub light extraction patterns 140*b*1, 140*b*2, 140*b*3, and 140*b*4 of the second subpixel SP2 described above with reference to FIG. 10, and thus, repeated descriptions thereof are omitted. For example, in FIG. 17, in the fourth light extraction pattern 140*d*, rotation angles of first to fourth sub light extraction patterns 140*d*1, 140*d*2, 140*d*3, and 140*d*4** may respectively be 18 degrees, 21 degrees, 24 degrees, and 27 degrees, but embodiments of the present disclosure are not limited thereto.

In each of the first to fourth subpixels SP1, SP2, SP3, and SP4, a boundary portion between the first to fourth pattern regions PR1 PR2, PR3, and PR4 may include a convex portion 143 having an irregular shape, and thus, reflection light reflected by the convex portion 143 of the boundary portion may have an irregular diffraction characteristic.

As described above, according to another embodiment of the present disclosure, the first to fourth subpixels SP1, SP2, SP3, and SP4 of each of the plurality of pixels P[1,1] to P[m,n] may respectively include four sub light extraction patterns which have rotated by different rotation angles, and thus, the regularity of reflection light reflected by the light extraction pattern 140 may more decrease or the randomness of the reflection light may more increase, thereby more preventing or more minimizing the occurrence of rainbow Mura where reflected light is spread in a radial shape and/or circular ring Mura where reflected light is spread in a radial shape. Accordingly, a black visibility characteristic or a black color (or black rising) phenomenon caused by the reflection of external light may be more reduced in a non-driving or off state.

FIGS. 18A to 18D are diagrams illustrating a rotation structure of a light extraction pattern according to another embodiment of the present disclosure. Except for that a pattern region of subpixel is modified, FIGS. 18A to 18D may be a same as FIG. 17 described above. Hereinafter, therefore, like reference numerals refer to like elements, and only different elements will be described. A bidirectional arrow illustrated in FIGS. 18A to 18D represents a rotation angle (or a rotation direction) of a light extraction pattern.

Figure 18A:
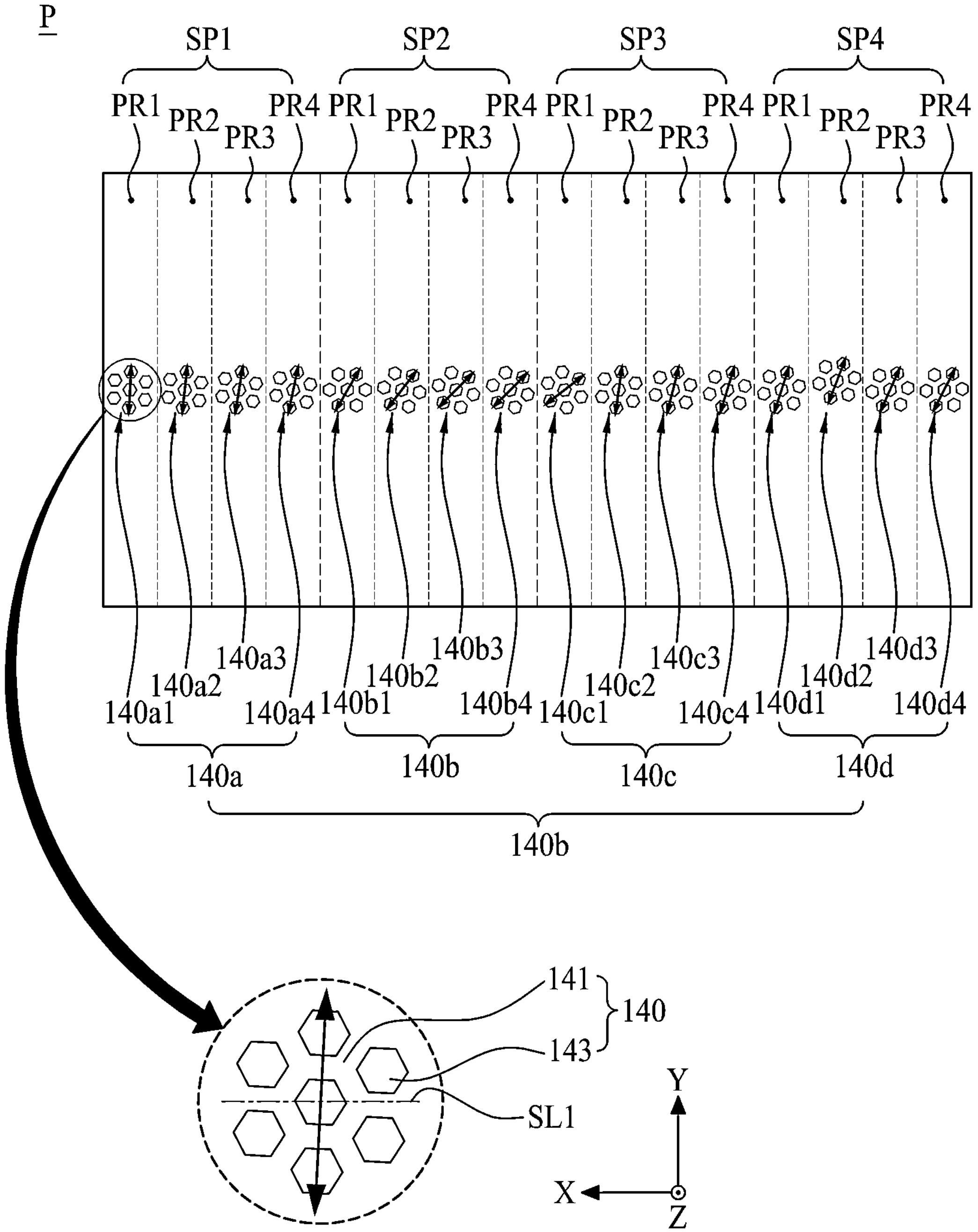
FIGS. 18A to 18D are a diagram illustrating a rotation structure of a light extraction pattern according to another embodiment of the present disclosure.

Referring to FIG. 18A, each of first to fourth pattern regions PR1, PR2, PR3, and PR4 configured at each of first to fourth subpixels SP1, SP2, SP3, and SP4 of each of a plurality of pixels P may be disposed in parallel along a first direction X within corresponding subpixels SP1, SP2, SP3, and SP4. For example, each of the first to fourth pattern regions PR1, PR2, PR3, and PR4 may have a rectangular shape which extends along a second direction Y. For example, the first to fourth pattern regions PR1, PR2, PR3, and PR4 may respectively have a left-right four-division structure (or a horizontal four-division tetragonal structure) by the first to fourth pattern regions PR1, PR2, PR3, and PR4. The first to fourth pattern regions PR1, PR2, PR3, and PR4 may have a same size (or area), but embodiments of the present disclosure are not limited thereto. For example, the first to fourth pattern regions PR1, PR2, PR3, and PR4 of the second subpixel SP2 may be a same as the first to fourth pattern regions PR1, PR2, PR3, and PR4 of a second subpixel SP2 described above with reference to FIG. 11. The first to fourth pattern regions PR1, PR2, PR3, and PR4 of the first, third, and fourth subpixels SP1, SP3, and SP4 may be configured to be equal to the first to fourth pattern regions PR1, PR2, PR3, and PR4 of the second subpixel SP2 described above with reference to FIG. 11.

Figure 18B:
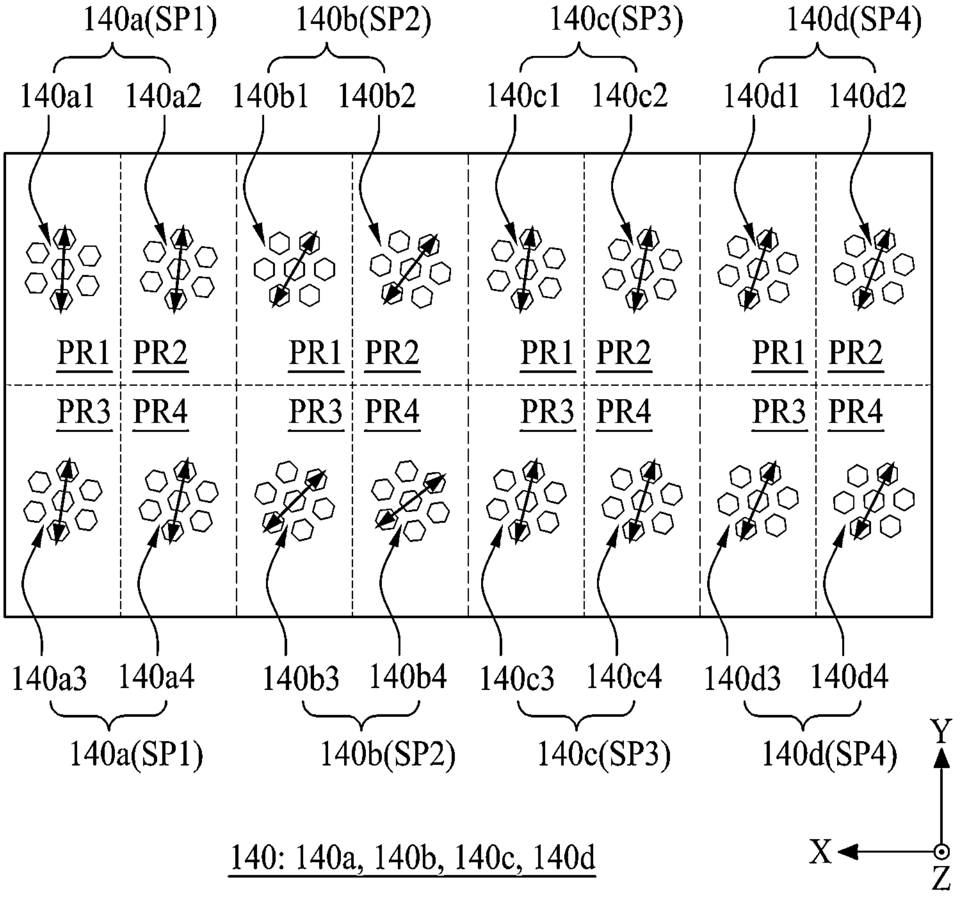

Referring to FIG. 18B, each of first to fourth pattern regions PR1, PR2, PR3, and PR4 configured at each of the first to fourth subpixels SP1, SP2, SP3, and SP4 of each of a plurality of pixels P may be disposed along each of the first direction X and the second direction Y within corresponding subpixels SP1, SP2, SP3, and SP4. For example, the first to fourth pattern regions PR1, PR2, PR3, and PR4 may be disposed in a lattice pattern shape within corresponding subpixels SP1, SP2, SP3, and SP4. For example, each of the first to fourth pattern regions PR1, PR2, PR3, and PR4 may have a rectangular shape which extends along the second direction Y. For example, each of the first to fourth subpixels SP1, SP2, SP3, and SP4 may have a vertical-horizontal division structure (or a four-division lattice pattern structure or a four-division tetragonal structure) by the first to fourth pattern regions PR1, PR2, PR3, and PR4. The first to fourth pattern regions PR1, PR2, PR3, and PR4 may have a same size (or area), but embodiments of the present disclosure are not limited thereto. For example, the first to fourth pattern regions PR1, PR2, PR3, and PR4 of the second subpixel SP2 may be a same as the first to fourth pattern regions PR1, PR2, PR3, and PR4 of the second subpixel SP2 described above with reference to FIG. 12. The first to fourth pattern regions PR1, PR2, PR3, and PR4 of the first, third, and fourth subpixels SP1, SP3, and SP4 may be configured to be equal to the first to fourth pattern regions PR1, PR2, PR3, and PR4 of the second subpixel SP2 described above with reference to FIG. 12.

Figure 18C:
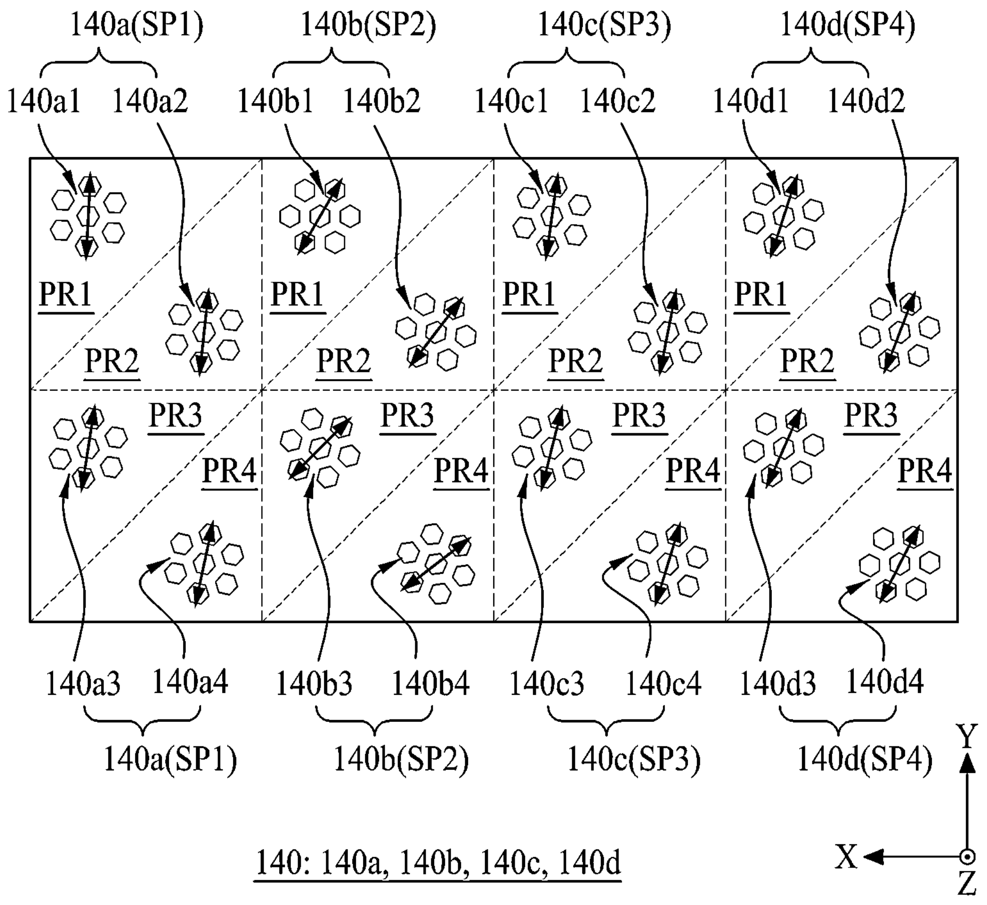

Referring to FIG. 18C, each of first to fourth pattern regions PR1, PR2, PR3, and PR4 configured at each of the first to fourth subpixels SP1, SP2, SP3, and SP4 of each of a plurality of pixels P may be disposed along the second direction Y within corresponding subpixels SP1, SP2, SP3, and SP4. For example, the first to fourth pattern regions PR1, PR2, PR3, and PR4 may be disposed along the second direction Y and a diagonal direction within the second subpixel SP2. For example, each of the first to fourth pattern regions PR1, PR2, PR3, and PR4 may have a triangular shape. For example, each of first to fourth subpixels SP1, SP2, SP3, and SP4 may have a diagonal division structure (or a vertical four-division triangular structure) by the first to fourth pattern regions PR1, PR2, PR3, and PR4. The first to fourth pattern regions PR1, PR2, PR3, and PR4 may have a same size (or area), but embodiments of the present disclosure are not limited thereto. For example, the first to fourth pattern regions PR1, PR2, PR3, and PR4 of the second subpixel SP2 may be a same as the first to fourth pattern regions PR1, PR2, PR3, and PR4 of the second subpixel SP2 described above with reference to FIG. 13. The first to fourth pattern regions PR1, PR2, PR3, and PR4 of the first, third, and fourth subpixels SP1, SP3, and SP4 may be configured to be equal to the first to fourth pattern regions PR1, PR2, PR3, and PR4 of the second subpixel SP2 described above with reference to FIG. 13.

Figure 18D:
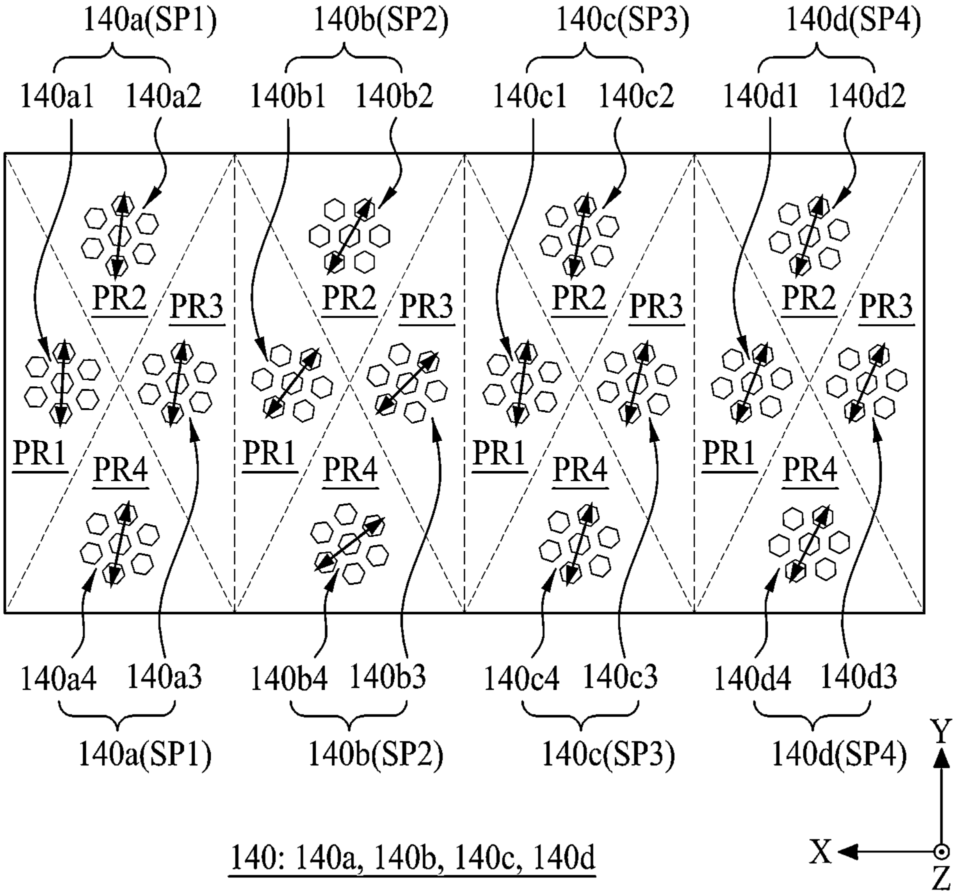

Referring to FIG. 18D, each of first to fourth pattern regions PR1, PR2, PR3, and PR4 configured at each of the first to fourth subpixels SP1, SP2, SP3, and SP4 of each of a plurality of pixels P may be disposed in a lattice pattern structure along each of the first direction X and the second direction Y within corresponding subpixels SP1, SP2, SP3, and SP4. For example, each of the first to fourth pattern regions PR1, PR2, PR3, and PR4 may have a triangular shape. For example, each of the first to fourth subpixels SP1, SP2, SP3, and SP4 may have a vertical-horizontal diagonal division structure (or a four-division triangular structure) by the first to fourth pattern regions PR1, PR2, PR3, and PR4. For example, the first to fourth pattern regions PR1, PR2, PR3, and PR4 of the second subpixel SP2 may be a same as the first to fourth pattern regions PR1, PR2, PR3, and PR4 of the second subpixel SP2 described above with reference to FIG. 14. The first to fourth pattern regions PR1, PR2, PR3, and PR4 of the first, third, and fourth subpixels SP1, SP3, and SP4 may be configured to be equal to the first to fourth pattern regions PR1, PR2, PR3, and PR4 of the second subpixel SP2 described above with reference to FIG. 14.

As described above, according to another embodiment of the present disclosure, each of the first to fourth subpixels SP1, SP2, SP3, and SP4 may include the first to fourth sub light extraction patterns which have rotated by different rotation angles, and thus, the regularity of reflection light reflected by the light extraction pattern 140 may more decrease or the randomness of the reflection light may more increase, thereby more preventing or more minimizing the occurrence of rainbow Mura where reflected light is spread in a radial shape and/or circular ring Mura where reflected light is spread in a radial shape. Accordingly, a black visibility characteristic or a black color (or black rising) phenomenon caused by the reflection of external light may be more reduced in a non-driving or off state.

An organic light emitting display apparatus according to an embodiment of the present disclosure will be described below.

An organic light emitting display apparatus according to an embodiment of the present disclosure may comprise a plurality of pixels on a substrate, each including a plurality of subpixels each including an emission area, a planarization layer including a light extraction pattern which is at the emission area of each of the plurality of subpixels and includes a plurality of concave portions, and a light emitting device layer on the light extraction pattern, one or more of the plurality of subpixels may comprise a plurality of pattern regions, and the light extraction pattern at each of the plurality of pattern regions may comprise a structure which has rotated with respect to a reference point.

According to one or more embodiments of the present disclosure, the light extraction pattern at each of the plurality of pattern regions may have rotated by different angles.

According to one or more embodiments of the present disclosure, a rotation angle of the light extraction pattern may be greater than 0 degrees and less than 60 degrees.

According to one or more embodiments of the present disclosure, a center portion or an end of any one of the plurality of concave portions at each of the plurality of subpixels is a reference point for the rotation of the light extraction pattern within the corresponding subpixel.

According to one or more embodiments of the present disclosure, the light extraction pattern at one or more of the plurality of subpixels has rotated by an angle different from that of the light extraction pattern at each of the other subpixels.

According to one or more embodiments of the present disclosure, one or more of the plurality of subpixels may comprise a first pattern region and a second pattern region, and an angle difference between a rotation angle of the light extraction pattern at the first pattern region and a rotation angle of the light extraction pattern at the second pattern region may be a maximum of 30 degrees.

According to one or more embodiments of the present disclosure, one or more of the plurality of subpixels may comprises first to fourth pattern regions, and an angle difference between rotation angles of the light extraction patterns at each of the first to fourth pattern regions, respectively, may be a maximum of 15 degrees.

According to one or more embodiments of the present disclosure, each of the plurality of subpixels may comprise the plurality of pattern regions.

According to one or more embodiments of the present disclosure, the plurality of subpixels may comprise a white subpixel, and the white subpixel may include the plurality of pattern regions.

According to one or more embodiments of the present disclosure, the plurality of pattern regions may be disposed along one direction of a first direction, a second direction intersecting with the first direction, and a diagonal direction between the first direction and the second direction.

According to one or more embodiments of the present disclosure, a boundary portion between the plurality of pattern regions may have an irregular shape.

According to one or more embodiments of the present disclosure, one or more of the plurality of subpixels may comprise a first pattern region and a second pattern region. The boundary portion may be a region between the concave portion disposed at an end of the first pattern region and the concave portion disposed at an end of the second pattern region. The boundary portion may have an irregular size, based on a distance between the concave portion disposed at the end of the first pattern region and the concave portion disposed at the end of the second pattern region According to one or more embodiments of the present disclosure, a rotation angle of the light extraction pattern at each of the plurality of subpixels may differ from each other by pixel units.

According to one or more embodiments of the present disclosure, some of the light extraction patterns at each of the plurality of pixels may have the same rotation angle, and the light extraction patterns having the same rotation angles may be spaced apart from one another by an interval corresponding to the plurality of pixels.

According to one or more embodiments of the present disclosure, the light extraction pattern at one or more of the plurality of subpixels may comprise a plurality of sub light extraction patterns at each of the plurality of pattern regions, respectively, and the plurality of sub light extraction patterns may have rotated with respect to the reference point.

According to one or more embodiments of the present disclosure, the plurality of sub light extraction patterns may have rotated by different angles.

According to one or more embodiments of the present disclosure, one or more of the plurality subpixels may comprise a first sub light extraction pattern and a second sub light extraction pattern, and an angle difference between a rotation angle of the first sub light extraction pattern and a rotation angle of the second sub light extraction pattern may be a maximum of 30 degrees.

According to one or more embodiments of the present disclosure, one or more of the plurality subpixels may comprise first to fourth sub light extraction patterns, and an angle difference between rotation angles of the first to fourth sub light extraction patterns may be a maximum of 15 degrees.

According to one or more embodiments of the present disclosure, each of the plurality of concave portions or the convex portion may have a planar structure having a hexagonal shape or a honeycomb shape.

According to one or more embodiments of the present disclosure, the organic light emitting display apparatus may further comprise a color filter layer between the light extraction pattern and the substrate.

The organic light emitting display apparatus according to an embodiment of the present disclosure can be applied to various electronic apparatuses. For example, the organic light emitting display apparatus according to an embodiment of the present disclosure can be applied to mobile devices, video phones, smart watches, watch phones, wearable devices, foldable devices, rollable devices, bendable devices, flexible devices, curved devices, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, and home appliances, or the like.

It will be apparent to those skilled in the art that various modifications and variations can be made in the organic light emitting display apparatus of the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display apparatus comprising:

a plurality of pixels on a substrate, each including a plurality of subpixels each including an emission area;

a planarization layer including a light extraction pattern overlapping the emission area of each of the plurality of subpixels and includes a plurality of concave portions; and a light emitting device layer on the light extraction pattern, wherein one or more of the plurality of subpixels comprise a plurality of pattern regions, wherein the light extraction pattern at each of the plurality of pattern regions comprises an orientation that is rotated with respect to an orientation of the substrate, and wherein the plurality of pattern regions are disposed along one direction of a first direction, a second direction intersecting with the first direction, and a diagonal direction between the first direction and the second direction.

2. The organic light emitting display apparatus of claim 1, wherein the light extraction pattern at each of the plurality of pattern regions is rotated by different angles.

3. The organic light emitting display apparatus of claim 1, wherein a rotation angle of the light extraction pattern is greater than 0 degrees and less than 60 degrees.

4. The organic light emitting display apparatus of claim 1, wherein a center portion or an end of any one of the plurality of concave portions at each of the plurality of subpixels is a reference point for the rotation of the light extraction pattern within the corresponding subpixel.

5. The organic light emitting display apparatus of claim 1, wherein the light extraction pattern at one or more of the plurality of subpixels has rotated by an angle different from that of the light extraction pattern at each of the other subpixels.

6. The organic light emitting display apparatus of claim 1, wherein one or more of the plurality of subpixels comprises a first pattern region and a second pattern region; and wherein an angle difference between a rotation angle of the light extraction pattern at the first pattern region and a rotation angle of the light extraction pattern at the second pattern region is a maximum of 30 degrees.

7. The organic light emitting display apparatus of claim 1, wherein one or more of the plurality of subpixels comprises first to fourth pattern regions; and wherein an angle difference between rotation angles of the light extraction patterns at each of the first to fourth pattern regions, respectively, is a maximum of 15 degrees.

8. The organic light emitting display apparatus of claim 1, wherein each of the plurality of subpixels comprises the plurality of pattern regions.

9. The organic light emitting display apparatus of claim 4, wherein the plurality of subpixels comprises a white subpixel; and the white subpixel includes the plurality of pattern regions.

10. A organic light emitting display apparatus comprising:

a plurality of pixels on a substrate, each including a plurality of subpixels each including an emission area;

a planarization layer including a light extraction pattern overlapping the emission area of each of the plurality of subpixels and includes a plurality of concave portions; and a light emitting device layer on the light extraction pattern, wherein one or more of the plurality of subpixels comprise a plurality of pattern regions, wherein the light extraction pattern at each of the plurality of pattern regions comprises an orientation that is rotated with respect to an orientation of the substrate, and wherein a boundary portion between the plurality of pattern regions has an irregular shape.

11. The organic light emitting display apparatus of claim 10, wherein one or more of the plurality of subpixels comprises a first pattern region and a second pattern region;

the boundary portion is a region between the concave portion disposed at an end of the first pattern region and the concave portion disposed at an end of the second pattern region; and the boundary portion has an irregular size, based on a distance between the concave portion disposed at the end of the first pattern region and the concave portion disposed at the end of the second pattern region.

12. The organic light emitting display apparatus of claim 1, wherein a rotation angle of the light extraction pattern at each of the plurality of subpixels differs from each other by pixel units.

13. The organic light emitting display apparatus of claim 1, wherein some of the light extraction patterns at each of the plurality of pixels have the same rotation angle, and the light extraction patterns having the same rotation angles are spaced apart from one another by an interval corresponding to the plurality of pixels.

14. The organic light emitting display apparatus of claim 1, wherein the light extraction pattern at one or more of the plurality of subpixels comprises a plurality of sub light extraction patterns at each of the plurality of pattern regions, respectively, and the plurality of sub light extraction patterns are rotated with respect to the orientation of the substrate.

15. The organic light emitting display apparatus of claim 14, wherein the plurality of sub light extraction patterns are rotated by different angles.

16. The organic light emitting display apparatus of claim 14, wherein one or more of the plurality subpixels comprises a first sub light extraction pattern and a second sub light extraction pattern, and wherein an angle difference between a rotation angle of the first sub light extraction pattern and a rotation angle of the second sub light extraction pattern is a maximum of 30 degrees.

17. The organic light emitting display apparatus of claim 14, wherein one or more of the plurality subpixels comprises first to fourth sub light extraction patterns, and wherein an angle difference between rotation angles of the first to fourth sub light extraction patterns is a maximum of 15 degrees.

18. An organic light emitting display apparatus comprising:

a plurality of pixels on a substrate, each including a plurality of subpixels each including an emission area;

a planarization layer including a light extraction pattern overlapping the emission area of each of the plurality of subpixels and includes a plurality of concave portions; and a light emitting device layer on the light extraction pattern, wherein one or more of the plurality of subpixels comprise a plurality of pattern regions, and wherein the light extraction pattern at each of the plurality of pattern regions comprises an orientation that is rotated with respect to an orientation of the substrate, and wherein each of the light extraction patterns each including the plurality of concave portions has a planar structure having a hexagonal shape or a honeycomb shape; and wherein a rotation angle of the light extraction pattern is greater than 0 degrees and less than 60 degrees.

19. The organic light emitting display apparatus of claim 1, further comprising a color filter layer between the light extraction pattern and the substrate.

20. The organic light emitting display apparatus of claim 18, wherein the light extraction pattern at one or more of the plurality of subpixels comprises a plurality of sub light extraction patterns at each of the plurality of pattern regions, respectively, and wherein the plurality of sub light extraction patterns are rotated with respect to the orientation of the substrate.

* * * * *